(12) United States Patent
Watanabe

(10) Patent No.: US 8,685,832 B2
(45) Date of Patent: Apr. 1, 2014

(54) TRENCH FILLING METHOD AND METHOD OF MANUFACTURING SEMICONDUCTOR INTEGRATED CIRCUIT DEVICE

(75) Inventor: Masahisa Watanabe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/594,217

(22) Filed: Aug. 24, 2012

(65) Prior Publication Data

US 2013/0052795 A1 Feb. 28, 2013

(30) Foreign Application Priority Data

Aug. 25, 2011 (JP) ................................. 2011-183684

(51) Int. Cl.
H01L 21/76 (2006.01)

(52) U.S. Cl.
USPC ........... 438/427; 438/296; 438/400; 438/690; 438/710; 257/637; 257/640; 257/E21.282; 257/E21.24

(58) Field of Classification Search
USPC ......... 438/296, 400, 437, 427, 690–693, 710, 438/723, 725, 424, 435, 763; 257/637–640, 257/644, E21.282, E21.24
See application file for complete search history.

(56) References Cited

U.S. PATENT DOCUMENTS

| | | | | |
|---|---|---|---|---|
| 6,156,620 A * | 12/2000 | Puchner et al. | ............... | 438/400 |
| 6,391,781 B1 * | 5/2002 | Ozawa et al. | ................. | 438/692 |
| 6,417,073 B2 * | 7/2002 | Watanabe | ..................... | 438/424 |
| 7,118,987 B2 * | 10/2006 | Fu et al. | .......................... | 438/435 |
| 7,319,058 B2 * | 1/2008 | Wang | ............................. | 438/259 |
| 7,541,298 B2 * | 6/2009 | Hsu et al. | ...................... | 438/789 |
| 8,530,311 B2 * | 9/2013 | Matsui | .......................... | 438/268 |
| 2002/0001917 A1 * | 1/2002 | Park | ................................ | 438/424 |
| 2003/0181049 A1 * | 9/2003 | Huang et al. | .................. | 438/694 |
| 2004/0115897 A1 * | 6/2004 | Inoue et al. | .................... | 438/424 |
| 2005/0186755 A1 * | 8/2005 | Smythe et al. | ................. | 438/424 |
| 2005/0196935 A1 * | 9/2005 | Ishitsuka et al. | .............. | 438/437 |
| 2006/0051931 A1 * | 3/2006 | Wellhausen | .................. | 438/424 |
| 2006/0128104 A1 * | 6/2006 | Prall et al. | ..................... | 438/279 |
| 2006/0154439 A1 * | 7/2006 | Lim | ............................... | 438/424 |
| 2007/0020875 A1 * | 1/2007 | Hsu et al. | ...................... | 438/424 |
| 2007/0212850 A1 * | 9/2007 | Ingle et al. | ..................... | 438/435 |
| 2008/0083947 A1 * | 4/2008 | Sakuma | ......................... | 257/324 |
| 2008/0166888 A1 * | 7/2008 | Hsu et al. | ...................... | 438/787 |
| 2008/0182381 A1 * | 7/2008 | Kiyotoshi | ...................... | 438/427 |
| 2009/0072355 A1 * | 3/2009 | Cheng et al. | ................... | 257/622 |
| 2009/0104791 A1 * | 4/2009 | Nemani et al. | ................ | 438/788 |
| 2009/0111240 A1 * | 4/2009 | Hashimoto | .................... | 438/427 |
| 2009/0124061 A1 * | 5/2009 | Kiyotoshi | ...................... | 438/435 |
| 2011/0024857 A1 * | 2/2011 | Toumiya et al. | .............. | 257/432 |

(Continued)

FOREIGN PATENT DOCUMENTS

JP 2010-263104 A 11/2010

*Primary Examiner* — Alexander Sofocleous
*Assistant Examiner* — Ankush Singal
(74) *Attorney, Agent, or Firm* — Nath, Goldberg & Meyer; Jerald L. Meyer

(57) ABSTRACT

Provided is a trench filling method, which includes: forming a silicon oxide liner on a semiconductor substrate with trenches formed therein, the trenches including narrow-width portions having a first minimum isolation width and wide-width portions having a second minimum isolation width being wider than the first minimum isolation width; forming an oxidation-barrier film on the silicon oxide liner; forming a silicon liner on the oxidation-barrier film; filling the narrow-width portions with a first filling material; filling the wide-width portions with a second filling material; and oxidizing the silicon liner.

15 Claims, 27 Drawing Sheets

(56) References Cited

U.S. PATENT DOCUMENTS

2011/0057287 A1* 3/2011 Mitsuhira et al. ............. 257/500
2011/0100489 A1* 5/2011 Orito et al. ................... 137/560
2011/0127634 A1* 6/2011 Eun .............................. 257/510
2011/0281443 A1* 11/2011 Chou et al. .................... 438/787
2012/0028437 A1* 2/2012 Watanabe et al. ............. 438/425
2012/0074478 A1* 3/2012 Sugimachi .................... 257/297
2012/0164842 A1* 6/2012 Watanabe et al. ............. 438/763
2012/0190167 A1* 7/2012 Huang et al. .................. 438/400

* cited by examiner

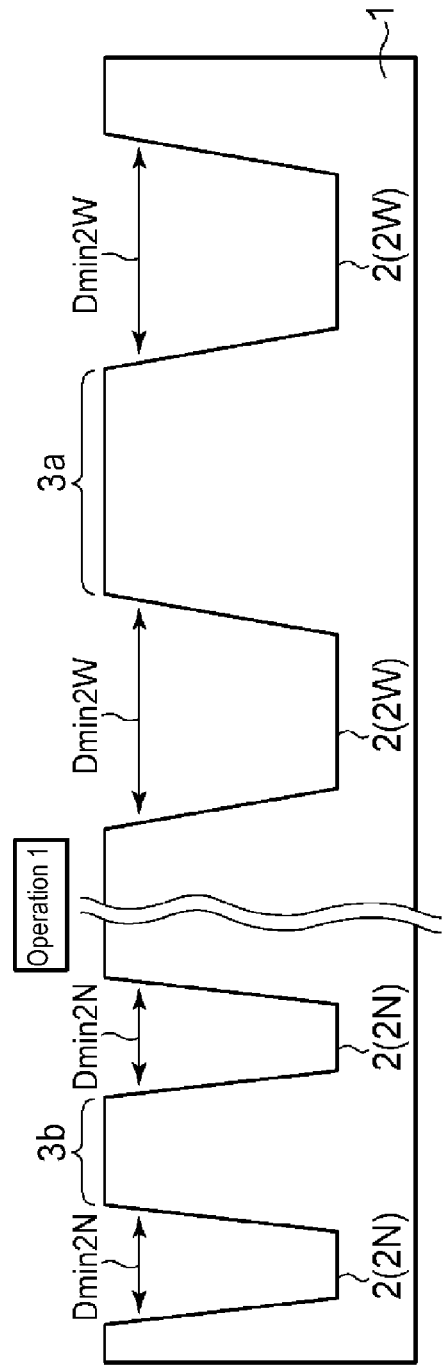

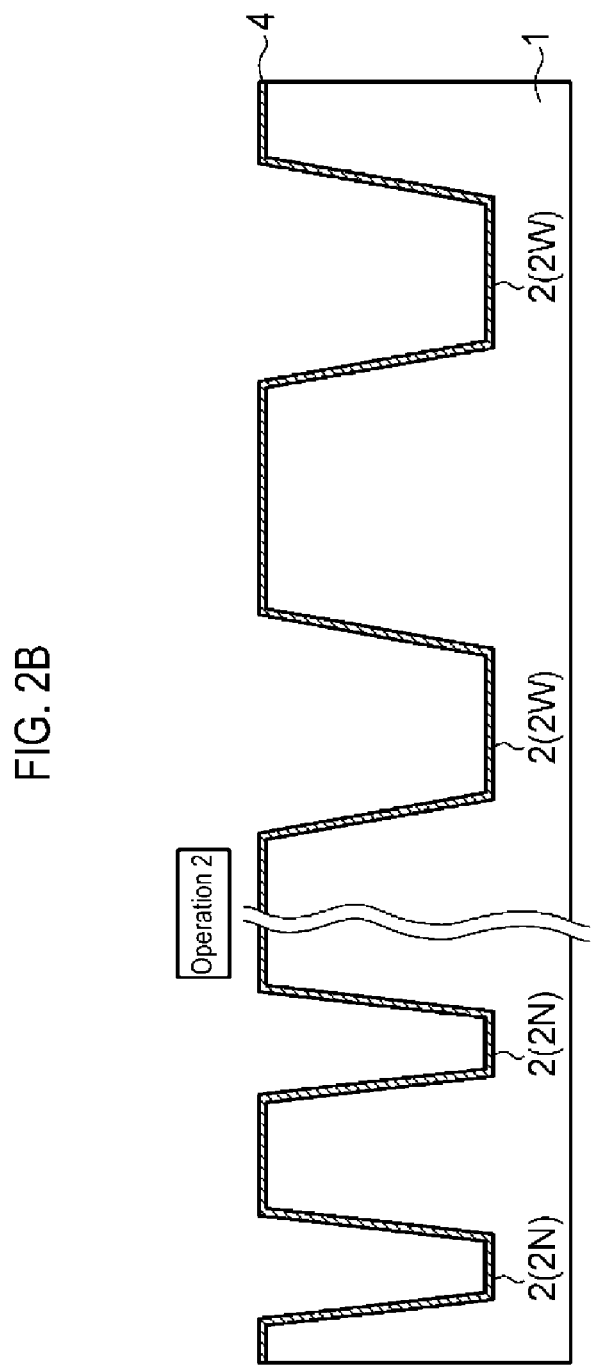

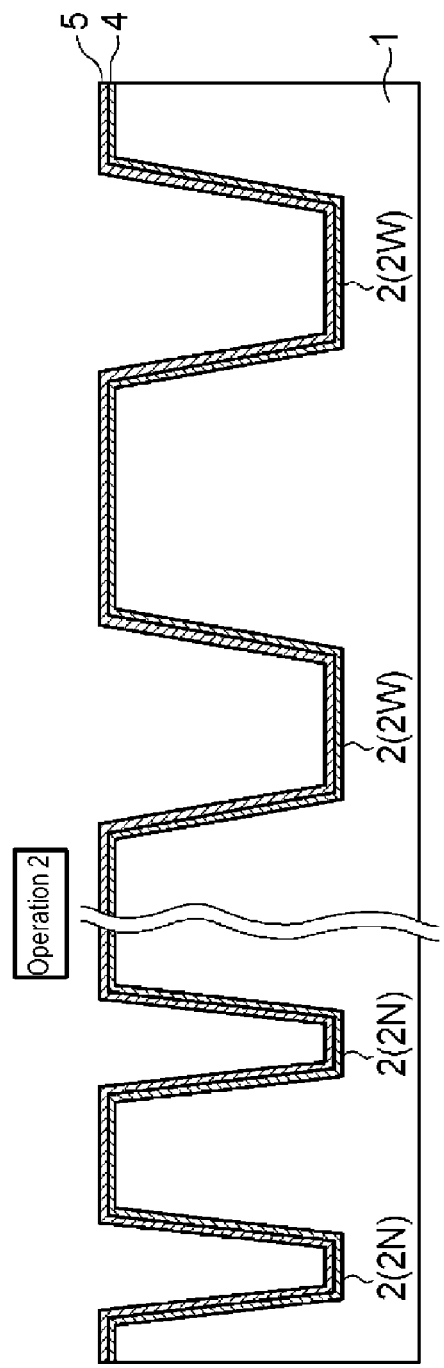

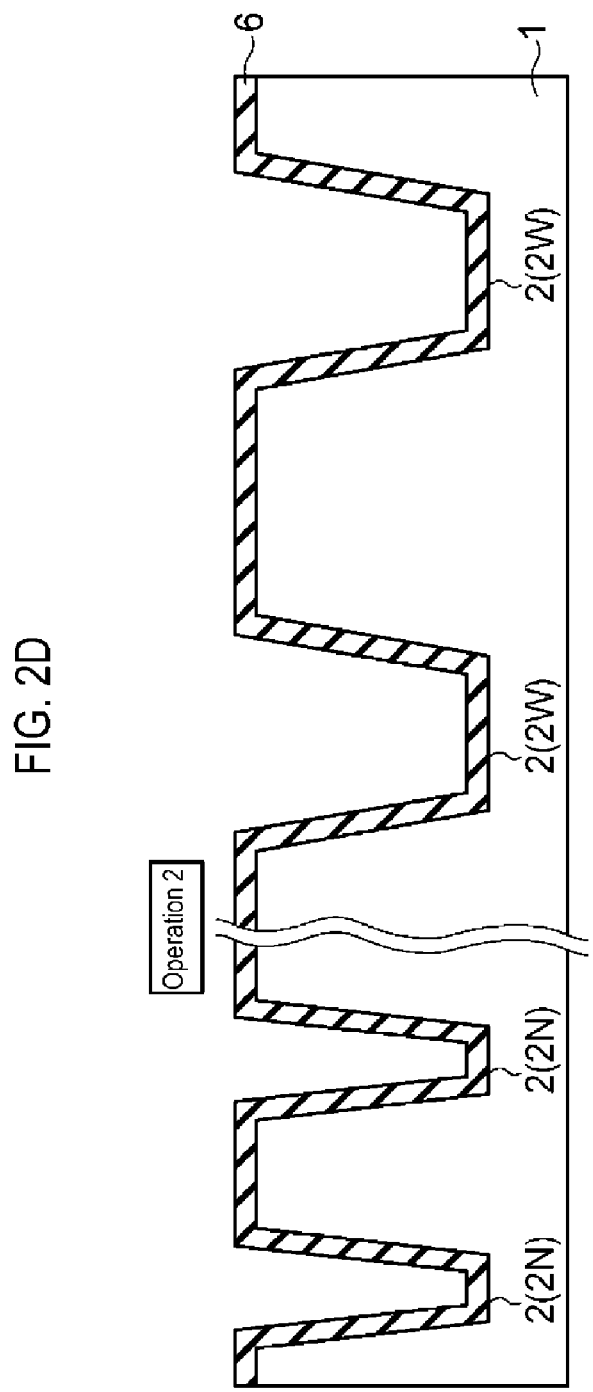

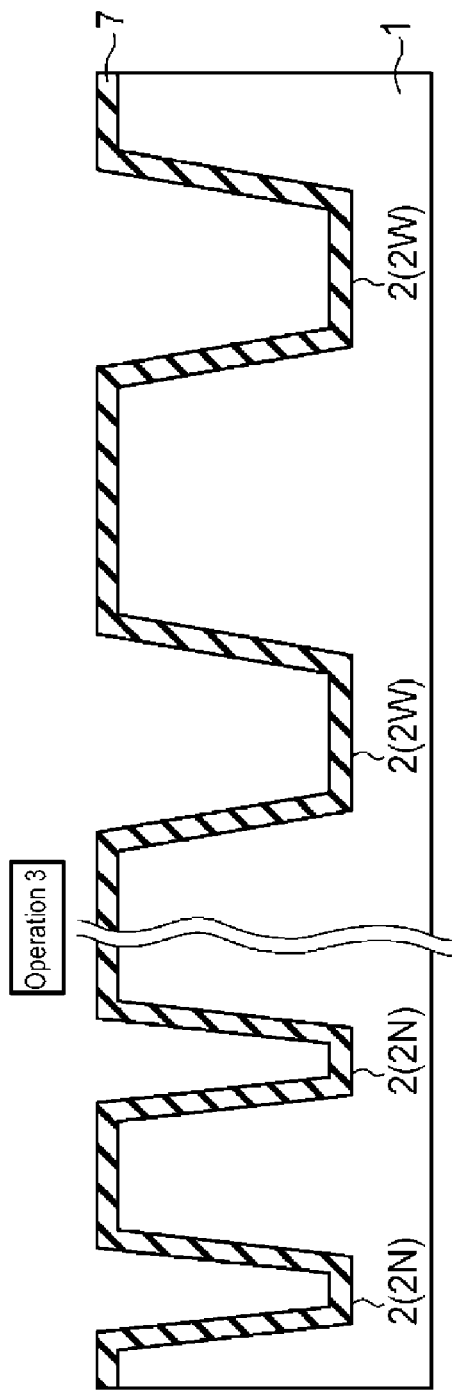

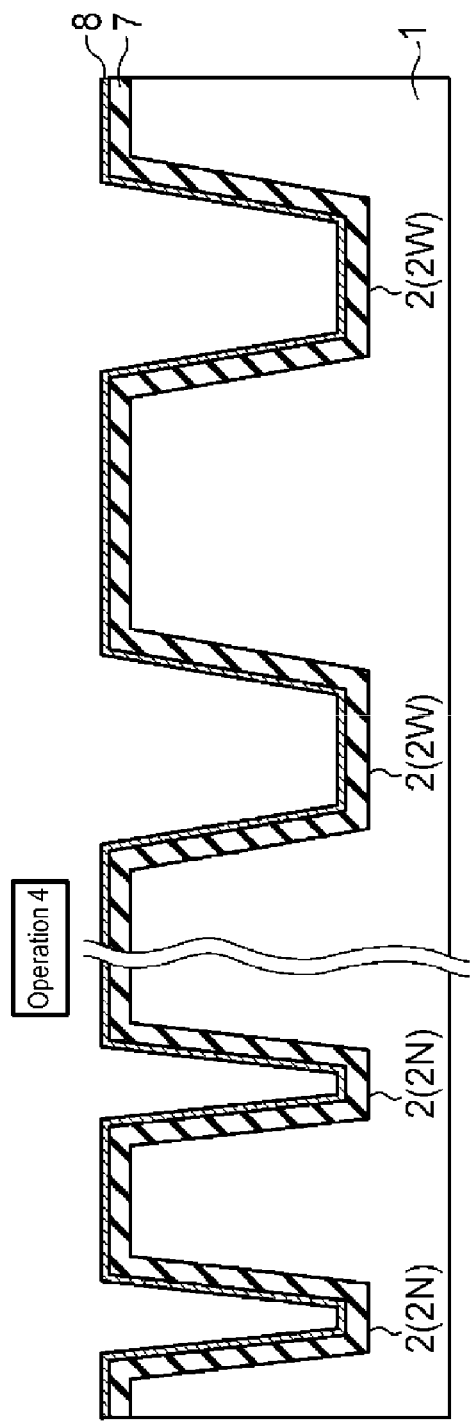

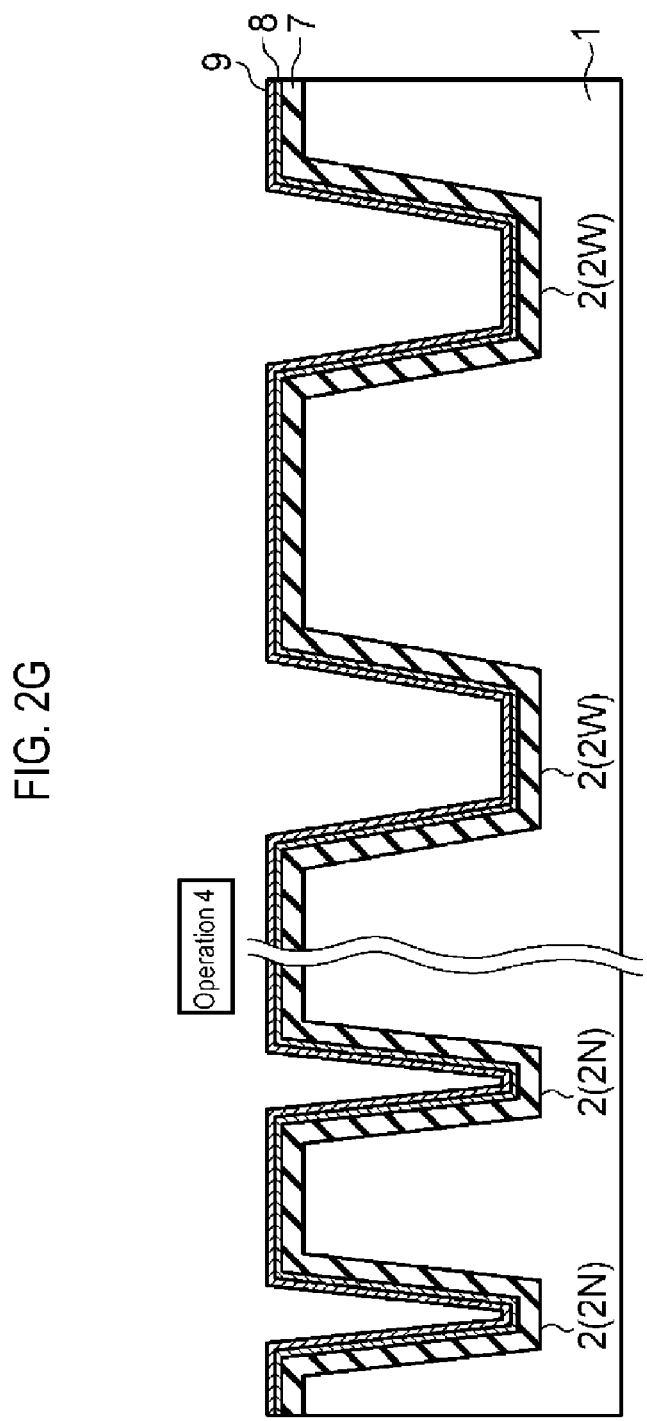

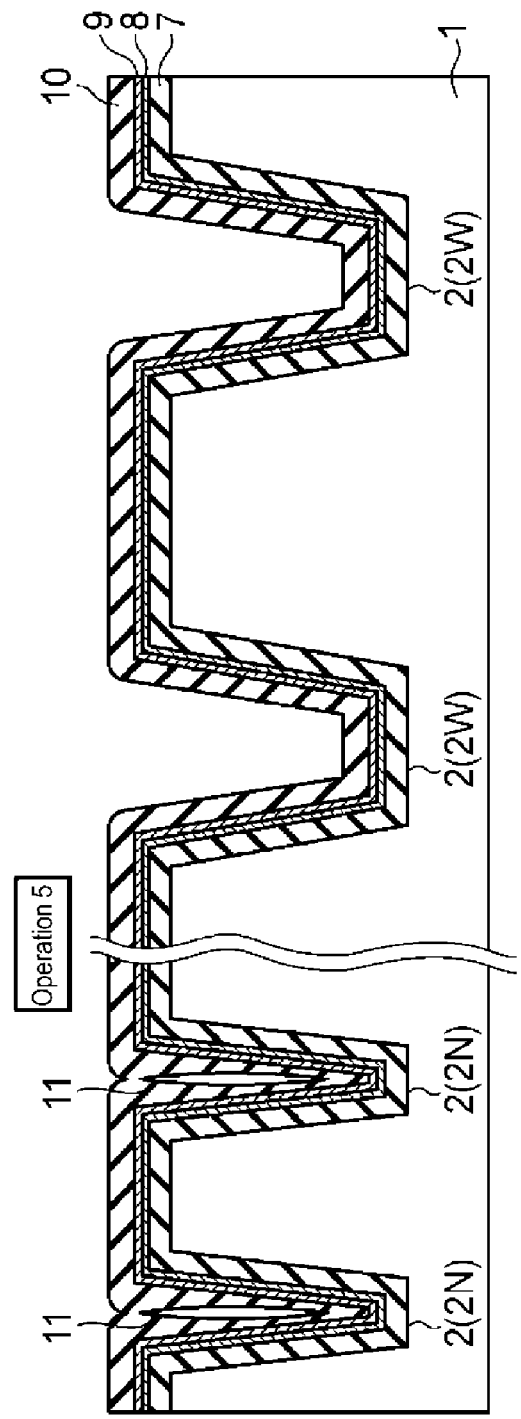

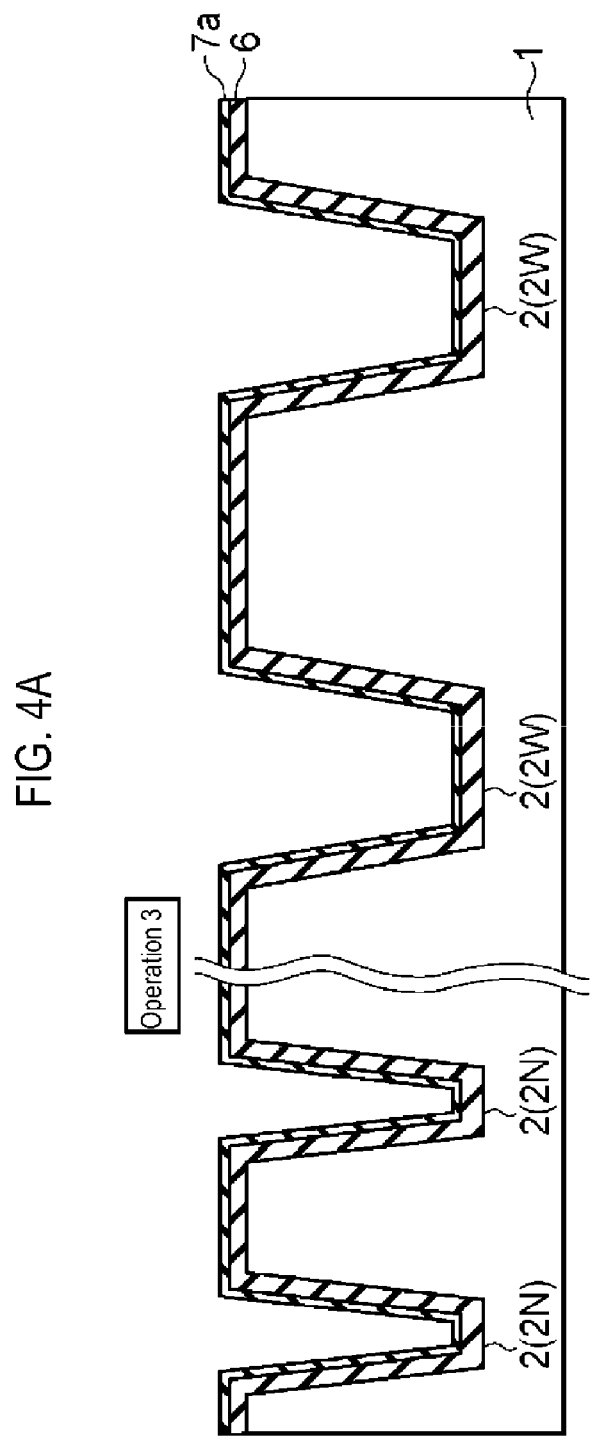

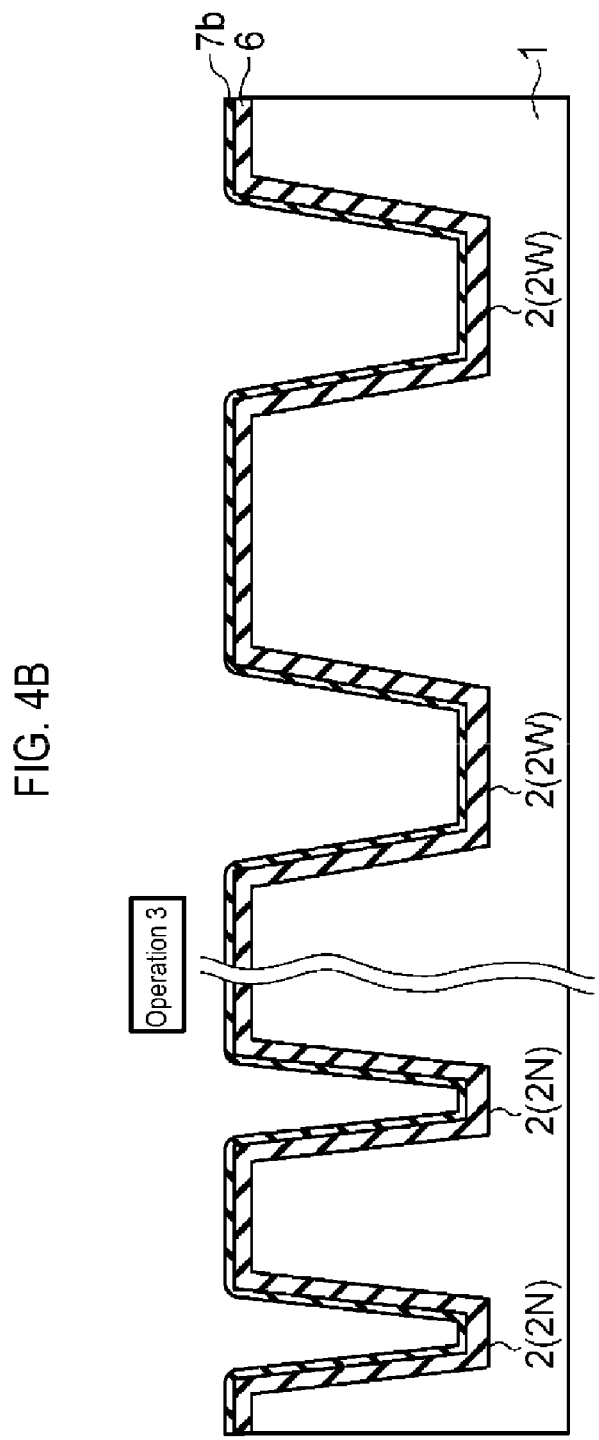

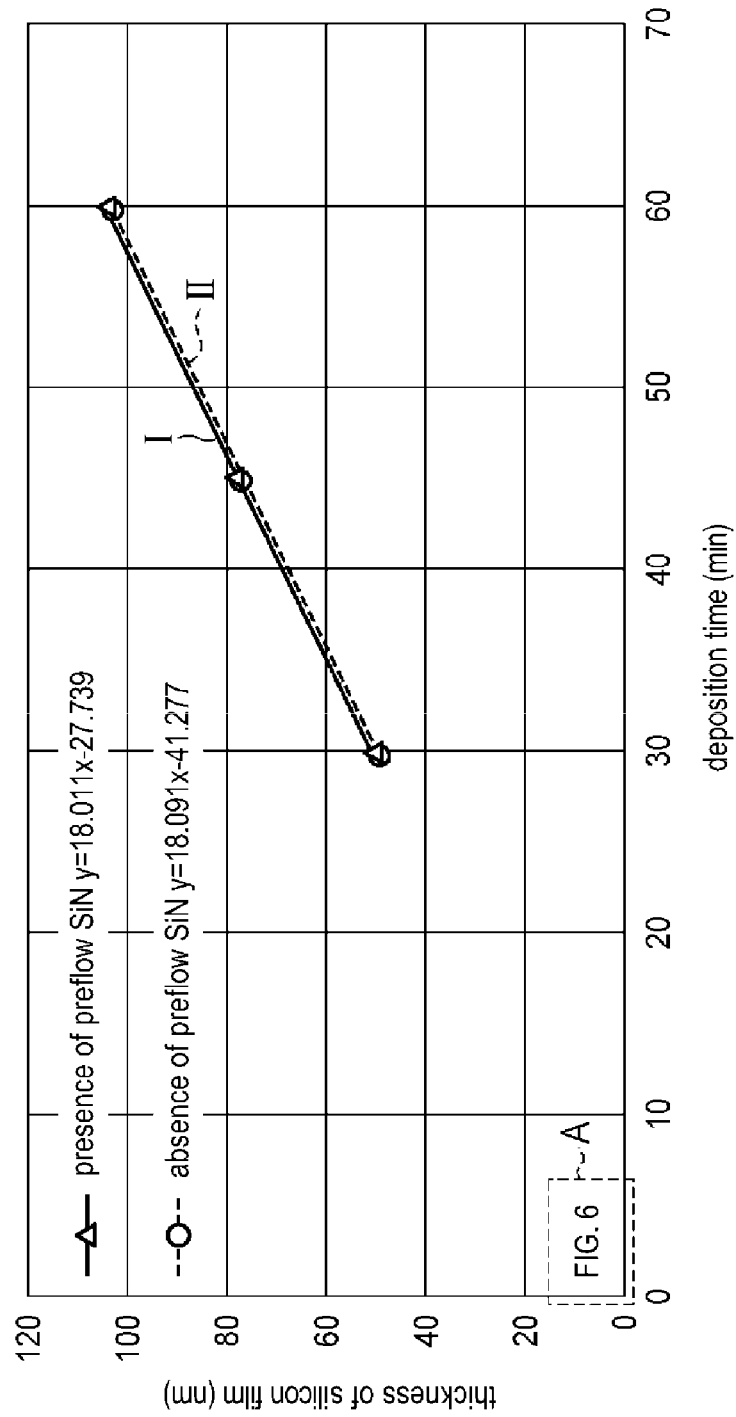

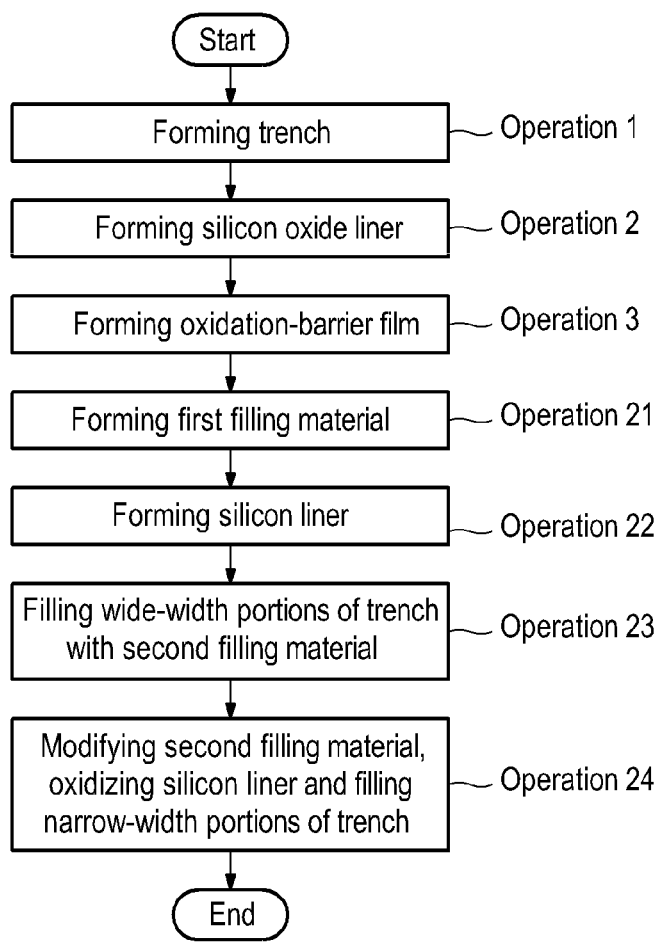

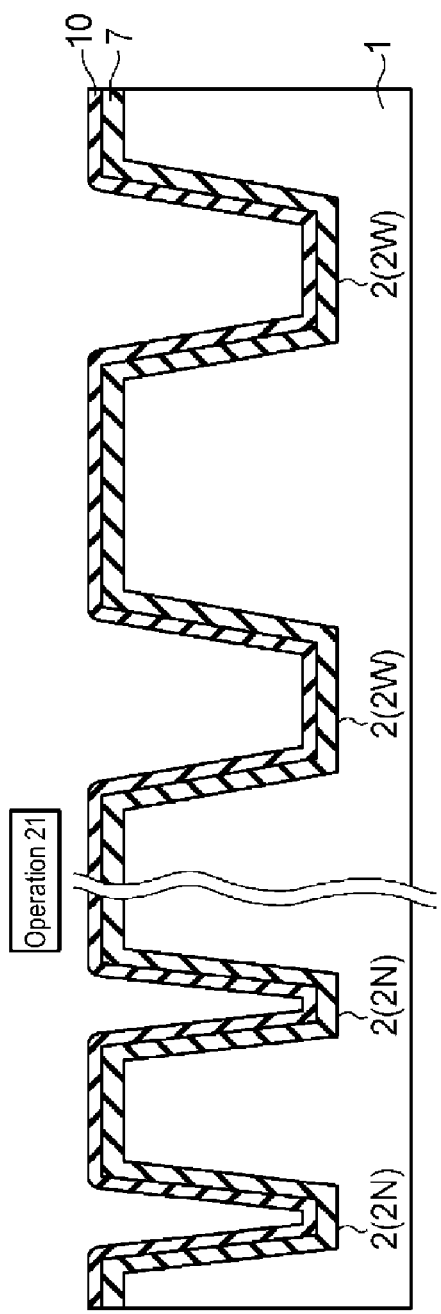

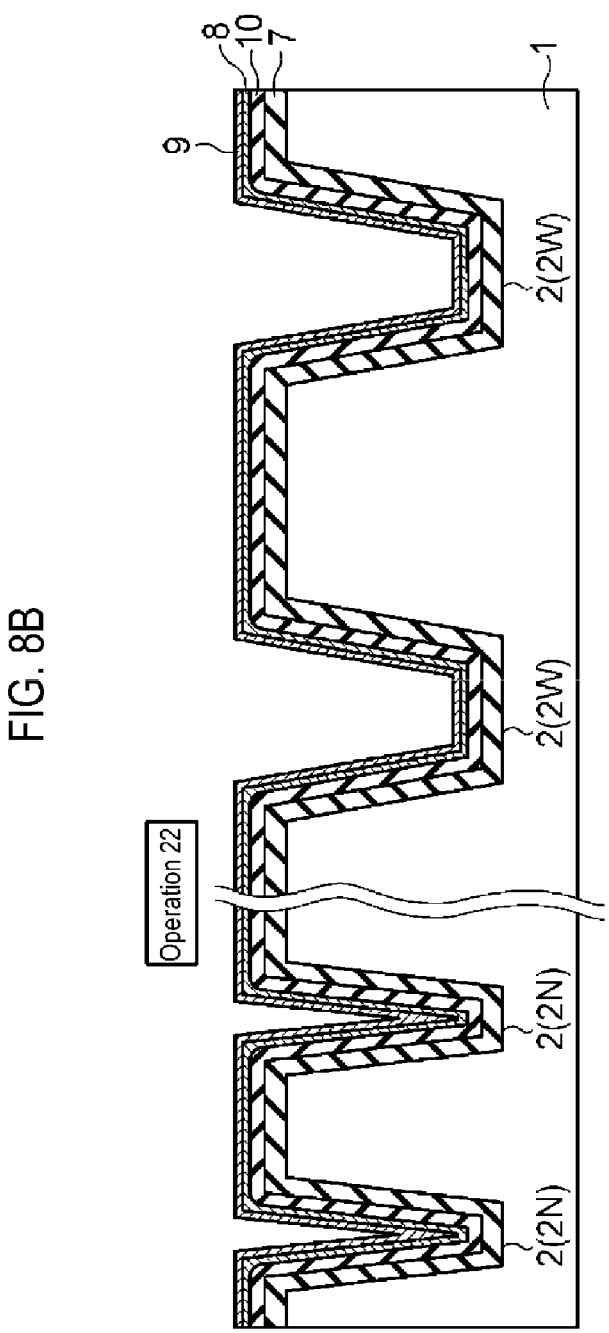

TRENCH FILLING METHOD AND METHOD OF MANUFACTURING SEMICONDUCTOR INTEGRATED CIRCUIT DEVICE

CROSS-REFERENCE TO RELATED APPLICATION

This application claims the benefit of priority from Japanese Patent Application No. 2011-183684, filed on Aug. 25, 2011, in the Japan Patent Office, the disclosure of which is incorporated herein in its entirety by reference.

TECHNICAL FIELD

The present disclosure relates to a trench filling method and a method of manufacturing a semiconductor integrated circuit device.

BACKGROUND

A semiconductor IC (Integrated Circuit) device includes a fine trench structure. A typical example of the fine trench structure is a STI (Shallow Trench Isolation) structure. The STI structure is a device isolation region that isolates active regions of a semiconductor device from each other. The STI structure is formed by forming a fine trench in a silicon substrate and filling the fine trench with a dielectric material.

A SOD (Spin-On Dielectric) material is known as an example of the dielectric material that fills the fine trench. In particular, attention is focused on an inorganic polymer containing PHPS (perhydropolysilazane: $SiH_2NH$) as the principal ingredient. For example, the PHPS may be modified into silicon oxide ($SiO_2$) when being sintered in a water-vapor atmosphere. A reaction formula thereof is as follows:

$$SiH_2NH + 2H_2O \rightarrow SiO_2 + NH_3 + 2H_2$$

However, as the high integration of the semiconductor device is improved, a width of the trench which is formed in the device isolation region becomes smaller, which results in a high aspect ratio. In the fine trench having the high aspect ratio, it is difficult to modify the SOD film or to fill the trench using an SOD process (or spin coating process), thus causing deterioration in the insulation property.

To address such a problem, a technique is known in which a silicon layer is formed on a semiconductor substrate that is exposed on the bottom of the trench corresponding to the device isolation region, using a selective epitaxial growth process, such that the aspect ratio of the trench is mitigated. In this manner, the technique improves modification of the SOD film and enables the trench to be filled by an SOD process, which prevents the insulation property of the device isolation region from being deteriorated, even when the trench is fine and has a high aspect ratio.

However, the aforementioned technique forms the SOD film in the inside of the trench. For this reason, as the high integration of the semiconductor device is further improved and the aspect ratio of the trench becomes higher, this leads to a recurrence of the poor modification of the SOD film and the difficulty of filling the trench by the SOD process. Further, this may cause a problem in that the insulation property of the device isolation region is degraded.

SUMMARY

The present disclosure provides to some embodiments of a trench filing method which is capable of preventing an insulation property of a device isolation region from being deteriorated, and a method of manufacturing a semiconductor IC device using the trench filling method, even if the high integration of the device is improved and an aspect ratio of the trench becomes higher.

According to one embodiment of the present disclosure, provided is a trench filling method, which includes: forming a silicon oxide liner on a semiconductor substrate with trenches formed therein, the trenches including narrow-width portions having a first minimum isolation width and wide-width portions having a second minimum isolation width being wider than the first minimum isolation width; forming an oxidation-barrier film on the silicon oxide liner; forming a silicon liner on the oxidation-barrier film; filling the narrow-width portions of the trenches with a first filling material; filling the wide-width portions of the trenches with a second filling material; and oxidizing the silicon liner.

According to another embodiment of the present disclosure, provided is a trench filling method, which includes: forming trenches in a semiconductor substrate, the trenches including narrow-width portions having a first minimum isolation width in a memory cell area and wide-width portions having a second minimum isolation width being wider than the first minimum isolation width in a peripheral circuit area; forming a silicon oxide liner on the semiconductor substrate on which the trenches are formed; forming an oxidation-barrier film on the silicon oxide liner; forming a silicon liner on the oxidation-barrier film; filling the trenches of the memory cell area with a first filling material; filling the trenches of the peripheral circuit area with a second filling material; and oxidizing the silicon liner.

According to another embodiment of the present disclosure, provided is a trench filling method, which includes: forming a silicon oxide liner on a semiconductor substrate with trenches formed therein, the trenches including narrow-width portions having a first minimum isolation width and wide-width portions having a second minimum isolation width being wider than the first minimum isolation width; forming an oxidation-barrier film on the silicon oxide liner; forming a first filling material on the oxidation-barrier film; forming a silicon liner on the first filling material; filling the wide-width portions of the trenches with a second filling material; and oxidizing the silicon liner to fill the narrow-width portions of the trenches.

According to another embodiment of the present disclosure, provided is a method of manufacturing a semiconductor integrated circuit (IC) device, which includes: forming trenches in a semiconductor substrate, the trenches including narrow-width portions having a first minimum isolation width in a memory cell area and wide-width portions having a second minimum isolation width being wider than the first minimum isolation width in a peripheral circuit area; forming a silicon oxide liner on the semiconductor substrate on which the trenches are formed; forming an oxidation-barrier film on the silicon oxide liner; forming a first filling material on the oxidation-barrier film; forming a silicon liner on the first filling material; filling the trenches of the peripheral circuit area with a second filling material; and oxidizing the silicon liner to fill the trenches of the memory cell area.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2A is a cross-sectional view showing a state of a substrate during Operation 1 illustrated in FIG. 1.

FIGS. 2B to 2D are cross-sectional views showing states of the substrate during Operation 2 illustrated in FIG. 1.

FIG. 2E is a cross-sectional view showing a state of the substrate during Operation 3 illustrated in FIG. 1.

FIGS. 2F to 2G are cross-sectional views showing states of the substrate during Operation 4 illustrated in FIG. 1.

FIG. 2H is a cross-sectional view showing a state of the substrate during Operation 5 illustrated in FIG. 1.

FIGS. 4A and 4B are cross-sectional views showing states of a substrate during Operation 3 illustrated in FIG. 1, according to another example.

FIG. 5 is a graph showing the relationship between a deposition time and a thickness of a silicon film.

FIG. 7 is a flowchart illustrating an example of a sequence of a trench filling method according to a second embodiment of the present disclosure.

FIG. 8A is a cross-sectional view showing a state of a substrate during Operation 21 illustrated in FIG. 7.

FIG. 8B is a cross-sectional view showing a state of the substrate during Operation 22 illustrated in FIG. 7.

DETAILED DESCRIPTION

Figure 1:
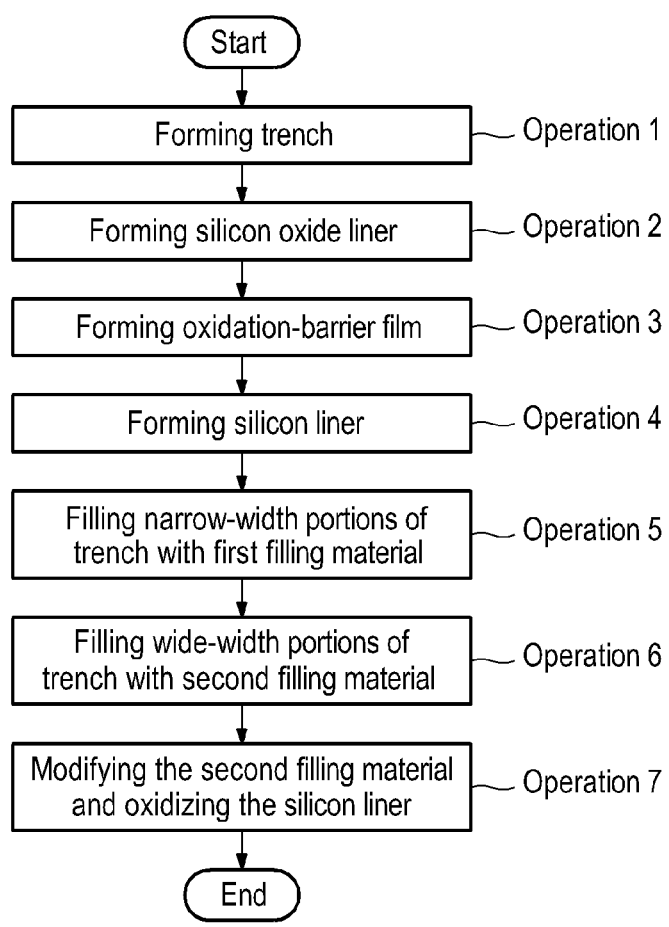
FIG. 1 is a flowchart illustrating an example of a sequence of a trench filling method according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the drawings, like reference numerals denote like elements.

First Embodiment

FIG. 1 is a flowchart illustrating an example of a sequence of a trench filling method according to a first embodiment of the present disclosure. FIGS. 2A to 2J are cross-sectional views showing states of a substrate during Operations 1 to 7 illustrated in FIG. 1.

<Operation 1: Formation of Trench>

In the first embodiment, an example of a sequence will be described using an example of a method of manufacturing a semiconductor IC (Integrated Circuit) device.

Figure 2I:
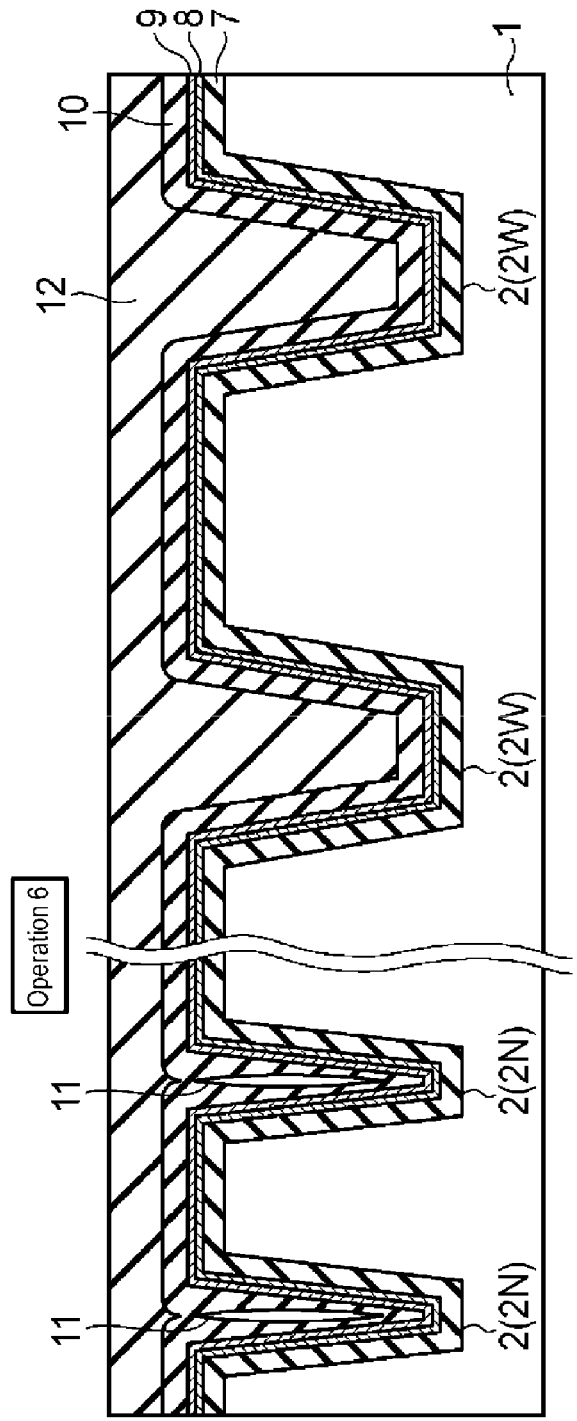
FIG. 2I is a cross-sectional view showing a state of the substrate during Operation 6 illustrated in FIG. 1.
Figure 3:
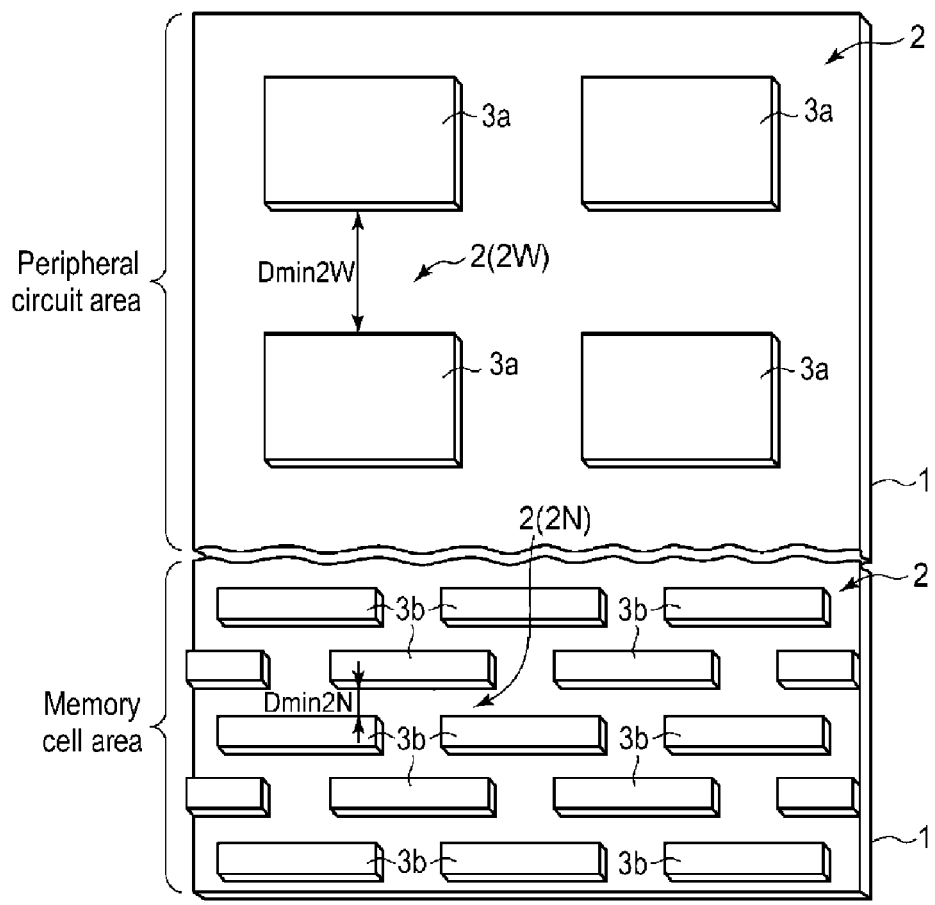
FIG. 3 is a view showing an illustrative plane pattern of a silicon substrate in which a trench is formed.

First, as illustrated in Operation 1 in FIG. 1, a trench is formed in a main surface of a semiconductor substrate. In this embodiment, as shown in FIG. 2A, a plurality of trenches for device isolation 2 having narrow-width portions 2N and wide-width portions 2W are formed in the main surface of a semiconductor substrate, e.g., silicon substrate 1. A minimum isolation width Dmin2W in each of the wide-width portion 2W is wider than a minimum isolation width Dmin2N in each of the narrow-width portion 2N. Examples of the semiconductor IC device having the trenches 2 configured as above may include a semiconductor memory device (e.g., DRAM, batch erase type EEPROM, etc.) in which memory cells are integrated, a memory-consolidated type semiconductor IC device (e.g., memory-consolidated system LSI, etc.), and so forth. FIG. 3 is a view showing an illustrative plane pattern of the silicon substrate 1 in which the trenches 2 having the narrow-width portions 2N and the wide-width portions 2W are formed.

As shown in FIG. 3, the narrow-width portions 2N can be in a memory cell area where a memory cell is formed. The wide-width portions 2W can be in a peripheral circuit area. In the peripheral circuit area, a circuit configured to read and write data on the memory cell, an input/output (I/O) circuit configured to perform input/output operations on data to be the written on the memory cell and data to be read out the memory cell, or the like, are formed. Regions, which are partitioned in a mesa shape by the trenches for device isolation 2 in the main surface of the silicon substrate 1, can be, for example, device active regions 3a and 3b (collectively referred to sometimes as "3") in which source/drain regions of a transistor will be formed later. The memory cell has a fine size and is formed in a plural number to secure a bulk memory capacity. To this end, the device active regions 3b in the memory cell area are formed in small sizes, which make the minimum isolation width Dmin2N of the trench 2 narrower. In this regard, the transistors in the peripheral circuit area are designed in consideration of a driving capacity thereof. Thus, the transistors in the peripheral circuit area are formed larger as compared to those in the memory cell area. Therefore, the device active regions 3a in the peripheral circuit area are formed larger as compared to the device active regions 3b in the memory cell area, which results in the minimum isolation width Dmin2W of the trench 2 being wider than the minimum isolation width Dmin2N of the trench 2.

<Operation 2: Formation of Silicon Oxide Liner>

Next, as illustrated in Operation 2 in FIG. 1, a silicon oxide liner is formed on the silicon substrate 1 in which the trenches 2 are formed in the main surface thereof.

In this embodiment, the silicon oxide liner may be formed by performing three sequences, which will be described later, in an effort to suppress a decrease in the area of the device active regions 3.

First, as shown in FIG. 2B, a first seed layer 4 is formed on the main surface of the silicon substrate 1. Specifically, the silicon substrate 1 is heated and an aminosilane-based gas is flowed to the surface of the heated silicon substrate 1, thereby forming the first seed layer 4 on the main surface of the silicon substrate 1.

For example, the aminosilane-based gas may be butylaminosilane (BAS), bistertiarybutylaminosilane (BTBAS), dimethylaminosilane (DMAS), bisdimethylaminosilane (BDMAS), tridimethylaminosilane (TDMAS), diethylaminosilane (DEAS), bisdiethylaminosilane (BDEAS), dipropylaminosilane (DPAS), and diisopropylaminosilane (DIPAS). In this embodiment, DIPAS is used as the aminosilane-based gas.

An example of the process conditions for forming the first seed layer 4 is as follows:

DIPAS Flow Rate: 200 sccm
Process Time: 1 min
Process Temperature: 400 degrees C.
Process Pressure: 133.3 Pa (1 Torr)

Forming the first seed layer 4 is a process for facilitating the absorption of a silicon raw material to the surface of the silicon substrate 1. Although the first seed layer 4 is described as being formed on the silicon substrate 1 in this embodiment, it is barely formed in an actual case. In some embodiments, the thickness of the first seed layer 4 may be equal to about the thickness of a monoatomic layer level. For example, the thickness of the first seed layer 4 may preferably fall within the range of 0.1 nm to 0.3 nm.

Subsequently, as shown in FIG. 2C, a silicon film 5 is formed on the first seed layer 4. Specifically, the silicon substrate 1 with the first seed layer 4 formed thereon is heated and a silicon raw material gas is flowed to the surface of the heated silicon substrate 1, thereby forming the silicon film 5 on the first seed layer 4.

An example of the silicon raw material gas may be an amino group-free silane-based gas. An example of the amino group-free silane-based gas may be a gas containing at least one of the following materials:

monosilane ($SiH_4$),
disilane ($Si_2H_6$),
silicon hydride expressed by $Si_mH_{2m+2}$ (wherein, m is a natural number being 3 or higher) and
silicon hydride expressed by $Si_nH_{2n}$ (wherein, n is a natural number being 3 or higher).

In this embodiment, disilane ($Si_2H_6$) is used as the silane-based gas. This is because a higher order silane than $SiH_4$ (monosilane), e.g., disilane ($Si_2H_6$), is suitable for forming a thin film. The formation of the silicon film 5 on the first seed layer 4 using disilane ($Si_2H_6$) results in a thin silicon film having a thickness of less than 3 nm, for example.

An example of the process conditions for forming the silicon film 5 is as follows:

Disilane Flow Rate: 200 sccm
Process Time: 12 min
Process Temperature: 400 degrees C.
Process Pressure: 133.3 Pa (1 Torr)

Using the aforementioned conditions of the disilane flow rate, the process temperature, and the process pressure, the amorphous silicon film 5 having a thickness of about 2 nm may be formed.

Thereafter, as shown in FIG. 2D, the first seed layer 4 and the silicon film 5 are subjected to oxidation, thereby forming a silicon oxide liner 6.

Fundamentally, various oxidation processes may be used in oxidizing the first seed layer 4 and the silicon film 5. Among them, a radical oxidation process may be preferable.

The radical oxidation process provides strong oxidizability. Thus, this process oxidizes the silicon film 5 at a low temperature of, e.g., about 500 degrees C. Further, the radical oxidation process provides less plane orientation dependence of the oxidation. This efficiently oxidizes only the silicon film 5 and the first seed layer 4 underlying the silicon film 5. For example, the silicon film 5 may be amorphous. Oxidizing the amorphous silicon film 5 using an oxidation process which performs a thermal oxidation at a high temperature of, e.g., about 700 degrees C., facilities crystallization of the silicon film 5, which may result in a polycrystalline silicon film. Performing the thermal oxidation on the polycrystalline silicon film 5 causes the silicon oxide liner 6 to have a non-uniform film thickness and a non-uniform film quality due to plane orientation dependence of the thermal oxidation. From such a point of view, the radical oxidation process, which provides the ability of performing a low temperature oxidation and has less plane orientation dependence of the oxidation, is suitable for the oxidation process of oxidizing the silicon film 5.

As described above, in the embodiment, a series of the sequences including the formation of the first seed layer 4, the formation of the silicon film 5, and the oxidation of both the first seed layer 4 and the silicon film 5 are performed, thereby avoiding oxidation of the silicon substrate 1. This prevents a decrease in the area of the device active region 3 formed in the silicon substrate 1.

<Operation 3: Formation of Oxidation-Barrier Film>

Subsequently, as illustrated in Operation 3 in FIG. 1, an oxidation-barrier film is formed. The oxidation-barrier film is a film having a property of blocking the passage of oxygen. Specific examples of the oxidation-barrier film include a silicon nitride film (SiN), a silicon oxynitride film (SiON) and a silicon carbonitride film (SiCN).

As a method of forming the oxidation-barrier film, two methods, i.e., nitriding a silicon oxide liner or forming the oxidation-barrier film on a silicon oxide liner, may be used. In this embodiment, nitriding the silicon oxide liner is explained.

Specifically, as shown in FIG. 2E, the silicon oxide liner 6 is subjected to nitriding, thereby modifying the silicon oxide liner 6 into the oxidation-barrier film 7 composed of a silicon oxynitride film.

Although in this embodiment, the silicon oxide liner 6 is described to be wholly subjected to nitriding, the present disclosure is not limited thereto. For example, the silicon oxide liner 6 may be partially subjected to nitriding. In this case, as shown in FIG. 4A, an oxidation-barrier film 7a containing a silicon oxynitride is formed on a surface portion of the silicon oxide liner 6.

Alternatively, when a material acting as an oxidation-barrier film is deposited on the silicon oxide liner 6, as shown in FIG. 4B, an oxidation-barrier film 7b is formed on the silicon oxide liner 6.

<Operation 4: Formation of Silicon Liner>

Thereafter, as illustrated in Operation 4 in FIG. 1, a silicon liner 9 is formed on the oxidation-barrier film 7. In this embodiment, the silicon liner 9 is formed by two sequences, which will be described later, for the purpose of forming a thin silicon liner having good step coverage.

First, as shown in FIG. 2F, a second seed layer 8 is formed on the oxidation-barrier film 7. Specifically, the silicon substrate 1 is heated and an aminosilane-based gas is flowed to the surface of the heated silicon substrate 1, thereby forming the second seed layer 8 on the oxidation-barrier film 7. Examples of the aminosilane-based gas are the same as those used in forming the first seed layer 4. The second seed layer 8 is a material which facilitates the absorption of the silicon raw material gas to the surface of the oxidation-barrier film 7. Further, the second seed layer 8 has very thin thickness as in the first seed layer 4, for example, a thickness of a monoatomic layer level. For example, the thickness of the second seed layer 8 may preferably fall within the range of 0.1 nm to 0.3 nm.

An example of the process conditions for forming the second seed layer 8 is as follows:
DIPAS Flow Rate: 200 sccm
Process Time: 1 min
Process Temperature: 400 degrees C.
Process Pressure: 133.3 Pa (1 Torr)

Thereafter, as shown in FIG. 2G, the silicon liner 9 is formed on the second seed layer 8. Specifically, the silicon substrate 1 with the second seed layer 8 formed thereon is heated and a silicon raw material gas is flowed to the surface of the heated silicon substrate 1, thereby forming the silicon liner 9 on the surface of the second seed layer 8. An example of the silicon raw material gas may be an amino group-free silane-based gas. Examples of the amino group-free silane-based gas are the same as those used in forming the silicon film 5.

The film thickness of the silicon liner 9 formed on the second seed layer 8 may be set in consideration of, e.g., the width of the trench 2, and in particular, the width of the narrow-width portion 2N. As such, depending on the film thickness of the silicon liner 9, a suitable material may be selected from the examples of the amino group-free silane-based gas.

For example, in the case that the film thickness of the silicon liner 9 needs to be less than 3 nm:

(1) after forming the second seed layer 8, a higher order silane-based gas than monosilane, e.g., disilane, is supplied to the second seed layer 8, thereby forming the silicon liner 9 on the second seed layer 8.

In the case that the film thickness of the silicon liner 9 needs to be 3 nm or more and less than 5 nm:

(2) after forming the second seed layer 8, a higher order silane-based gas than monosilane, e.g., disilane, is supplied to the second seed layer 8, thereby allowing a silicon to be thinly absorbed to the surface of the second seed layer 8. Thereafter, a lower order silane-based gas than disilane, e.g., monosilane, is supplied to the second seed layer 8, thereby forming the silicon liner 9 on the second seed layer 8 to which the silicon is thinly absorbed.

In the case that the film thickness of the silicon liner 9 needs to be 5 nm or more:

(3) after forming the second seed layer 8, monosilane is supplied to the second seed layer 8, thereby forming the silicon liner 9 on the second seed layer 8.

In this example, the sequence (2) is employed. In this case, an example of the process conditions for forming the silicon liner 9 is as follows:
<Supply of Disilane>
Disilane Flow Rate: 200 sccm
Process Time: 4.3 min
Process Temperature: 400 degrees C.
Process Pressure: 133.3 Pa (1 Torr)
<Supply of Monosilane>
Monosilane Flow Rate: 200 sccm
Process Time: 8 min
Process Temperature: 490 degrees C.
Process Pressure: 53.3 Pa (0.4 Torr)

Under the conditions described above, the amorphous silicon liner 9 having a thin thickness of about 3.5 nm is formed.

The thickness of the silicon liner 9 has an important function of compensating for a shrinkage amount of a subsequently-formed filling material. Although the compensation amount is determined by the sum of the thickness of the second seed layer 8 and the thickness of the silicon liner 9, the second seed layer 8 facilitates the adsorption of the silicon raw material gas, e.g., monosilane or disilane, and has a very thin thickness as mentioned above. Accordingly, the thickness of the silicon liner 9 after the expansion thereof occupies most of the compensation amount. That is, the compensation amount is determined mostly by the thickness of the silicon liner 9.

By forming the second seed layer 8 in advance, it is possible to form a thinner silicon liner 9 having a good step coverage. One of the reasons that it has such good step coverage is that an incubation time can be reduced by forming the second seed layer 8.

FIG. 5 is a graph showing the relationship between a deposition time (or process time) and a thickness of the silicon (Si) film. Specifically, FIG. 5 shows actual measurement values when the silicon film is formed on a silicon nitride film (SiN). The thickness of the silicon film was measured at three points when the deposition time (or process time) was 30 min, 45 min, and 60 min.

Line I of FIG. 5 represents the results when the seed layer was formed using an aminosilane-based gas (i.e., there is a preflow), and line II of FIG. 5 represents the results when no seed layer is formed (i.e., there is no preflow). Lines I and II are lines that were obtained by linear approximation based on the three measured film thicknesses using a least square method, and Equations thereof are as follows:

$$\text{Line } I: y=18.011x-27.739 \quad (1)$$

$$\text{Line } II: y=18.091x-41.277 \quad (2)$$

As shown in FIG. 5, it is apparent that the thickness of the silicon film is greater when there is a preflow than when there is no preflow.

Figure 6:
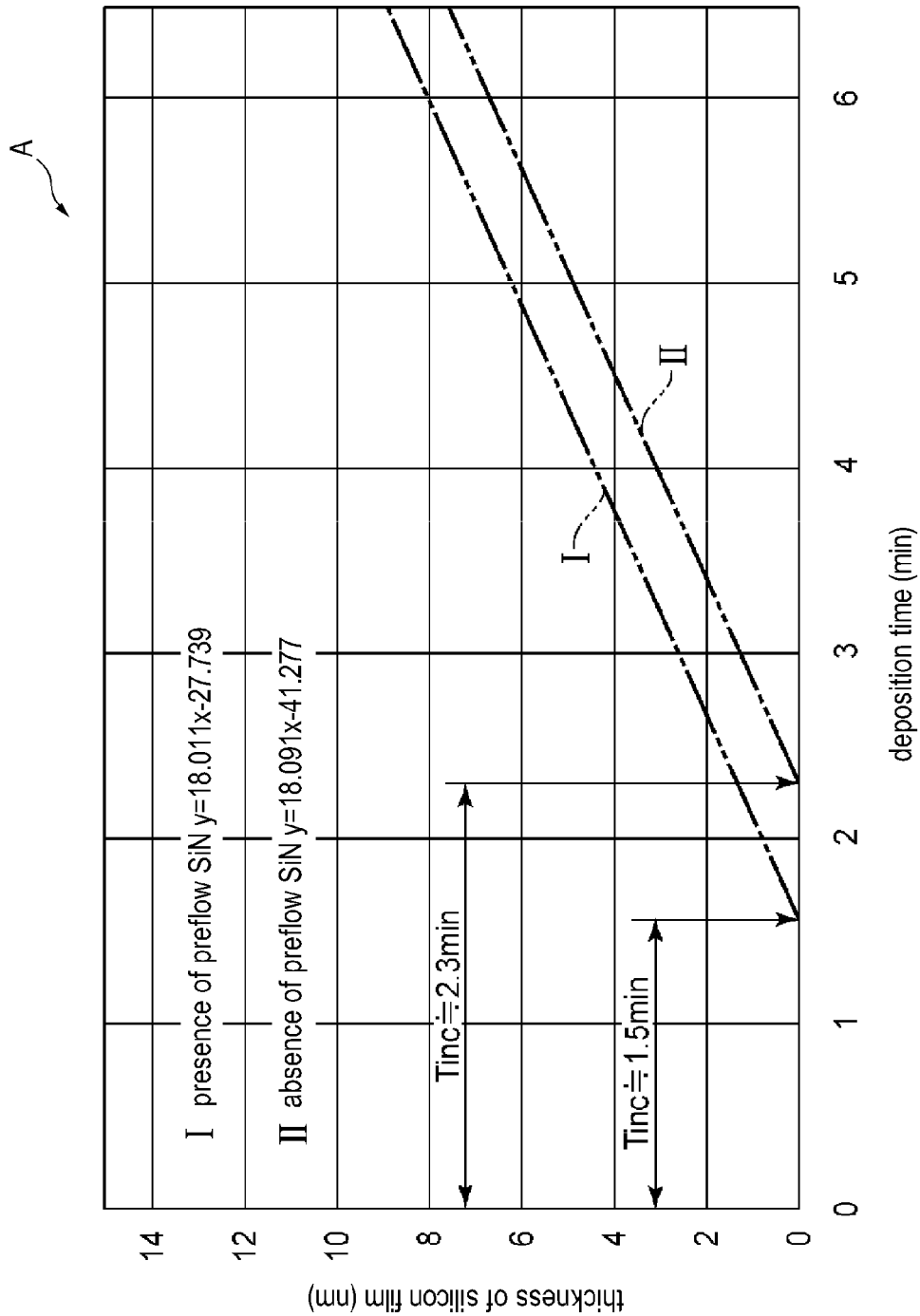
FIG. 6 is an expanded view of a broken-line frame A in FIG. 5.

FIG. 6 is an expanded view of a broken-line frame A in FIG. 5, which shows the intersections where lines I and II meet the deposition time axis, respectively. The intersections are obtained when y=0 in Equations (1) and (2); that is, when the thickness of the silicon film is 0.

As shown in FIG. 6, when there is a preflow, the deposition of the silicon film starts at about 1.5 min (x≈1.540) from the initiation of the process. On the other hand, when there is no preflow, the deposition of the silicon film starts at about 2.3 min (x≈2.282) from the initiation of the process.

In this manner, the incubation time Tinc can be reduced from about 2.3 min to about 1.5 min by preflowing an aminosilane-based gas to the silicon nitride film.

<Operation 5: Filling of Narrow-Width Portion of Trench>

Thereafter, as illustrated in Operation 5 in FIG. 1, a first filling material is formed on the silicon liner 9, thereby filling the narrow-width portions 2N of the trench 2.

In this embodiment, an ALD-silicon oxide film (ALD-$SiO_2$) 10 formed by an Atomic Layer Deposition (ALD) process is used as the first filling material. In this case, as shown in FIG. 2H, the narrow-width portions 2N are filled with the ALD-silicon oxide film 10 and the wide-width portions 2W are covered with the ALD-silicon oxide film 10 with a shape corresponding to its convex-concave shape.

During the process, a tiny seam 11 (or gap opened in an aperture shape) is formed in the inside of each of the narrow-width portions 2N without being completely filled with the ALD-silicon oxide film 10. This results from a step coverage of the ALD-silicon oxide film 10.

<Operation 6: Filling of Wide-Width Portion of Trench>

Subsequently, as illustrated in Operation 6 in FIG. 1, a second filling material is formed on the ALD-silicon oxide film 10, thereby filling the wide-width portions 2W of the trench 2.

In this embodiment, a filling material that shrinks by sintering is used as the second filling material. An example of a material that changes into a silicon oxide by sintering may be an inorganic polymer containing a PHPS (perhydropolysilazane: $SiH_2NH$) as the principal ingredient. The PHPS is a fluid material having a property of being modified into a silicon oxide by sintering and is formed by a SOD process. In this way, as shown in FIG. 2I, the wide-width portions 2W are filled with a PHPS film 12.

<Operation 7: Oxidation of Silicon Liner>

Thereafter, as illustrated in Operation 7 in FIG. 1, the silicon liner 9 is oxidized. The oxidation of the silicon liner 9 is performed through the PHPS film 12 and the ALD-silicon oxide film 10. Thus, normally, it takes some time to fully oxidize the silicon liner 9. However, in this embodiment, the oxidation-barrier film 7, which blocks the passage of oxygen, is formed under the silicon liner 9. This limits the progress of oxidation to the silicon substrate 1, thus fully oxidizing the silicon liner 9.

Figure 2J:
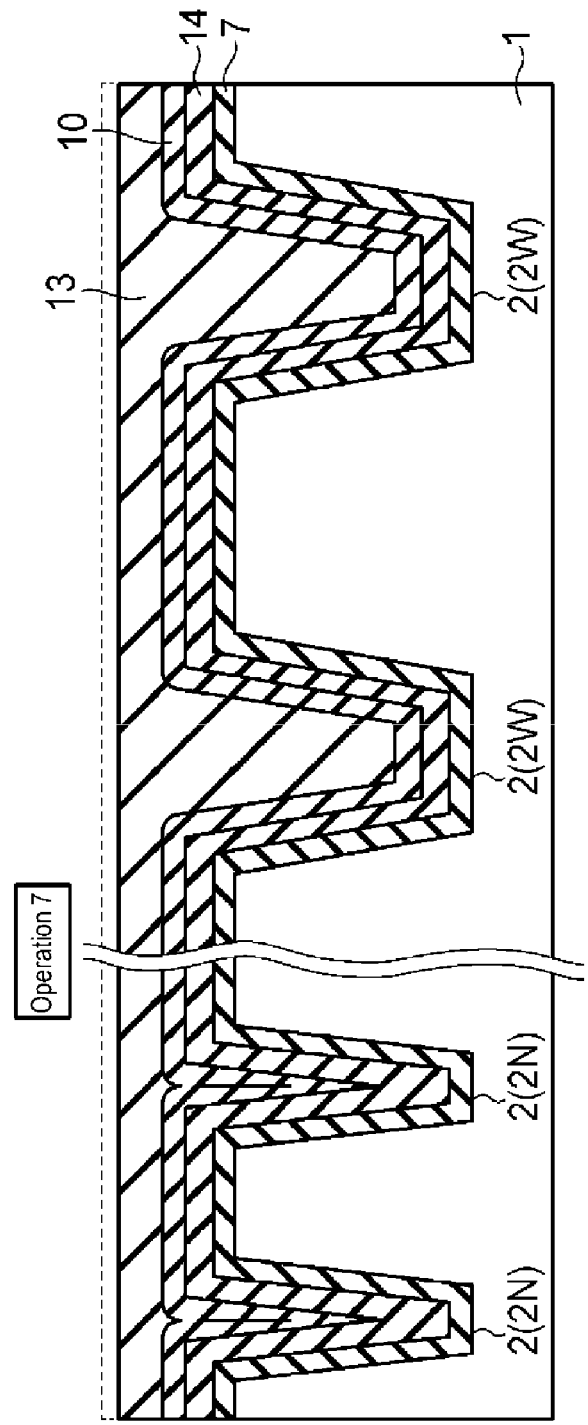
FIG. 2J is a cross-sectional view showing a state of the substrate during Operation 7 illustrated in FIG. 1.

In this embodiment, the silicon liner 9 is subjected to a wet oxidation in an atmosphere containing water and/or a hydroxyl group. The reason why a wet oxidation was chosen was in order to oxidize the silicon liner 9 through the ALD-silicon oxide film 10. Specifically, a wet oxidation was chosen because it has a stronger oxidizability than a dry oxidation. During the wet oxidation, as shown in FIG. 2J, the PHPS film 12 is modified, thereby changed it into a silicon oxide film 13. The PHPS film 12 is shrunk while being changed into the silicon oxide film 13. The shrinkage amount of the PHPS film 12 is compensated by an expansion amount that occurs when the silicon liner 9 is oxidized and is changed into a silicon oxide film 14. As shown in FIG. 2J, this limits the occurrence of voids, which are caused by the shrinkage of the PHPS film 12, in the inside of the wide-width portions 2W of the trench 2. Further, the tiny seams 11 formed in the inside of the narrow-width portions 2N are closed by the expanded silicon oxide film 14. This limits the generation of voids, which are caused by the tiny seams 11, in the inside of the narrow-width portions 2N.

According to the first embodiment as described above, it is possible to fill the narrow-width portions 2N of the trench 2 with the oxidation-barrier film 7, the first filling material (i.e., the ALD-silicon oxide film 10), and the silicon oxide film 14 without any gaps. In addition, it is possible to further fill the wide-width portions 2W of the trench 2 with the silicon oxide film 13 without any gaps, in addition to the insulating materials for filling the narrow-width portions 2N.

In particular, the narrow-width portions 2N of the trench 2 are mainly filled with the ALD-silicon oxide film 10, thus preventing the PHPS film 12 from being formed in the inside of the narrow-width portion 2N. Thus, even if the high integration of the device is further improved and thus an aspect ratio of the trench 2 is further increased, it is possible to prevent the occurrence of a poor modification of the PHPS film 12 and makes it difficult to fill the PHPS film 12 into the inside of the narrow-width portion 2N of the trench 2 by the SOD process.

In addition, even if the tiny seams 11 of a gap shape, which are caused by the step coverage of the ALD-silicon oxide film 10, occur in the narrow-width portions 2N, the tiny seams 11 can be closed by changing and expanding the silicon liner 9 into the silicon oxide film 14. This allows the narrow-width portions 2N to be filled with the ALD-silicon oxide film 10 and the silicon oxide film 14 without any gaps, and also reduces the possibility of degradation of the insulating property in the narrow-width portions 2N.

Therefore, according to the first embodiment, even if the high integration of the device is further improved and thus the aspect ratio of the trench for device isolation is increased, it is possible to achieve the trench filling method, which is capable of suppressing degradation of the insulating property of the device isolation region, and a method of manufacturing a semiconductor IC device using the trench filling method.

Second Embodiment

In the first embodiment, after the formation of the silicon liner 9 (in Operation 4), the first filling material is formed (in Operation 5). However, Operations 4 and 5 may be performed in a reversed order. The second embodiment relates to an example in which Operations 4 and 5 are performed in the reversed order.

FIG. 7 is a flowchart illustrating an example of a sequence of a trench filling method according to the second embodiment of the present disclosure. FIGS. 8A to 8D are schematic cross-sectional views showing states of a substrate during Operations 21 to 24 in FIG. 7, respectively.

<Operations 1 to 3: Formation of Trench, Silicon Oxide Liner and Oxidation-Barrier Film>

Operations 1 to 3 in FIG. 7 are substantially the same as Operations 1 to 3 described in the first embodiment, and therefore, an explanation thereof will be omitted.

<Operation 21: Formation of First Filling Material>

In the second embodiment, as illustrated in Operation 21 in FIG. 7, a first filling material is formed on the oxidation-barrier film 7. As in the first embodiment, the first filling material is an ALD-silicon oxide film 10.

In the second embodiment, unlike in the first embodiment, as shown in FIG. 8A, the ALD-silicon oxide film 10 is formed to thinly cover both the narrow-width portions 2N and the wide-width portions 2W corresponding to their convex-concave shapes. This is to prevent the narrow-width portions 2N from being closed while having the tiny seams 11 formed therein as shown in FIGS. 2H and 2I. In this case, a thin thickness of the ALD-silicon oxide film 10 is not always preferable. Rather, the ALD-silicon oxide film 10 is designed to have a sufficient thickness to close the narrow-width portions 2N without any gaps by the expansion of the silicon liner, which will be described in later processes.

<Operation 22: Formation of Silicon Liner>

Thereafter, as illustrated in Operation 22 in FIG. 7, a silicon liner is formed on the ALD-silicon oxide film 10.

In the second embodiment, as shown in FIG. 8B, the silicon liner 9 is formed after the formation of the second seed layer 8 on the ALD-silicon oxide film 10, as in the first embodiment. Prior to forming the silicon liner 9, an aminosilane-based gas is supplied to the ALD-silicon oxide film 10 to form the second seed layer 8, thus achieving the silicon liner 9 having a thin thickness and a good step coverage, as in the first embodiment.

<Operation 23: Filling of Wide-Width Portion of Trench>

Thereafter, as illustrated in Operation 23 in FIG. 7, a second filling material is formed on the silicon liner 9, thereby filling the wide-width portions 2W of the trench 2.

Figure 8C:
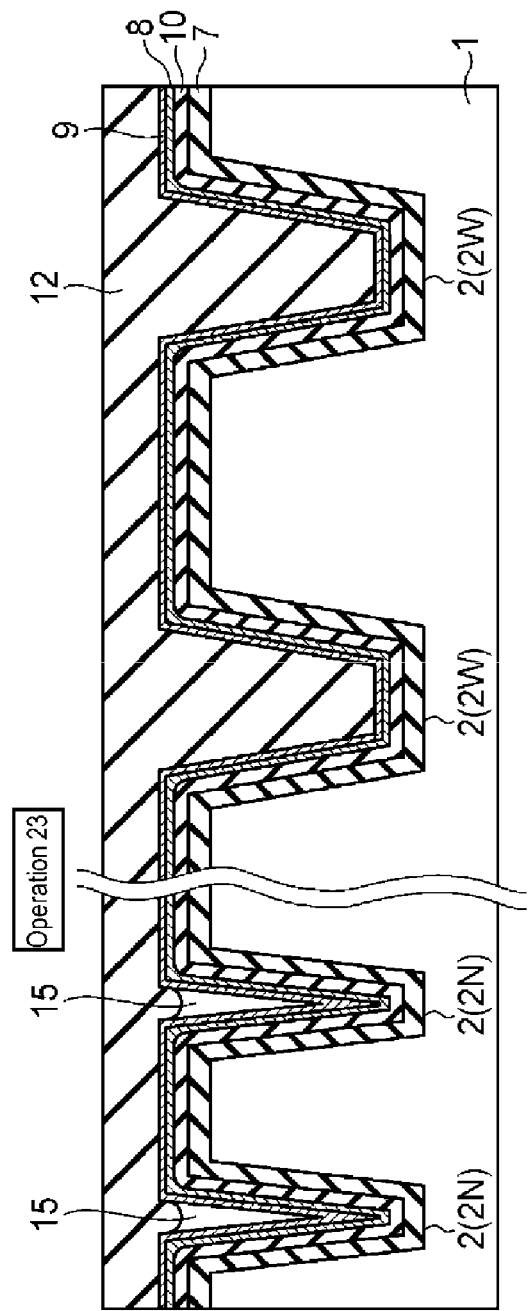
FIG. 8C is a cross-sectional view showing a state of the substrate during Operation 23 illustrated in FIG. 7.

In the second embodiment, a filling material that shrinks by sintering, e.g., an inorganic polymer containing PHPS as the principal ingredient, is used as the second filling material, as in the first embodiment. The inorganic polymer is coated on the silicon liner 9 by an SOD process, thereby forming the PHPS film 12. In this manner, the wide-width portions 2W are filled with the PHPS film 12. In addition, the silicon liner 9 formed on the narrow-width portions 2N is formed so that the opening in each of the narrow-width portions 2N is narrowed, thus making it difficult for the inorganic polymer to penetrate to each of the narrow-width portions 2N. This creates voids 15, as shown in FIG. 8C.

<Operation 24: Oxidation of Silicon Liner and Filling of Narrow-Width Portions of Trench>

Subsequently, as illustrated in Operation 24 in FIG. 7, the silicon liner 9 is oxidized.

Figure 8D:
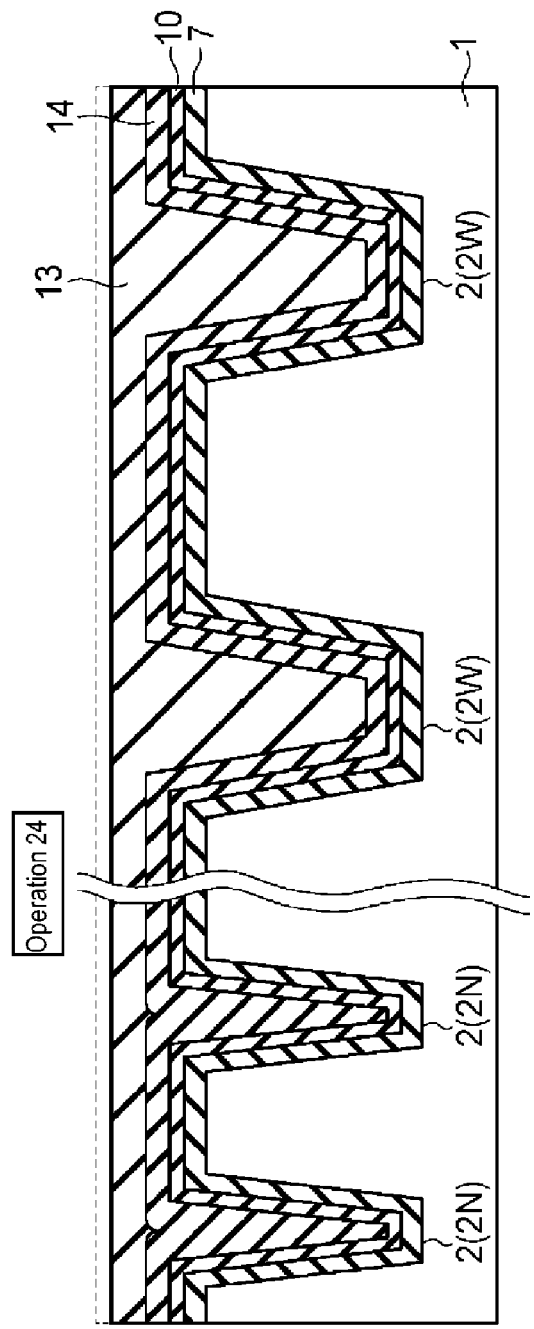
FIG. 8D is a cross-sectional view showing a state of the substrate during Operation 24 illustrated in FIG. 7.

In the second embodiment, the silicon liner 9 is subjected to a wet oxidation through the PHPS film 12, as in the first embodiment. As shown in FIG. 8D, the wet oxidation modifies the PHPS film 12 such that the PHPS film 12 is changed into the silicon oxide film 13. Even in this embodiment, the shrinkage amount of the PHPS film 12 is compensated by an expansion amount occurs when the silicon liner 9 is oxidized and is changed into the silicon oxide film 14. Accordingly, similar to the first embodiment, it is possible to limit the occurrence of voids, which are caused by the shrinkage of the PHPS film 12, in the inside of the wide-width portions 2W of the trench 2.

Although a dry oxidation having, e.g., only $O_2$ atmosphere may be applied to the PHPS film 12, it is preferable to oxidize the PHPS film 12 in a wet atmosphere containing water and/or a hydroxyl group, in light of performing the modification of the PHPS film 12 at the same time. The same may be applied to the first embodiment.

Even if the voids 15 are formed in the inside of the narrow-width portions 2N, the voids 15 can be closed by the expanded silicon oxide film 14. Thus, it is possible to fill the inside of the narrow-width portions 2N while suppressing the formation of apertures caused by the voids 15 inside of the narrow-width portions 2N.

As described above, according to the second embodiment, as in the first embodiment, it is possible to fill the narrow-width portions 2N of the trench 2 with the oxidation-barrier film 7, the first filling material (i.e., the ALD-silicon oxide film 10), and the silicon oxide film 14 without any gaps. Further, it is possible to fill the wide-width portions 2W of the trench 2 with the silicon oxide film 13 without any gaps, in addition to the insulating materials for filling the narrow-width portions 2N.

Therefore, according to the second embodiment, even if the high integration of device is further improved and thus an aspect ratio of the trench 2 for device isolation is further increased, it is possible to achieve the trench filling method, which is capable of suppressing degradation of the insulating property of the device isolation region, and a method of manufacturing a semiconductor IC device using the trench filling method.

(Film-Forming Apparatus)

Next, a description will be given as to an example of a film-forming apparatus which is capable of forming the silicon oxide liner, the oxidation-barrier film, the first filling material and the silicon liner.

<Film-Forming Apparatus for Forming Silicon Oxide Liner>

Figure 9:
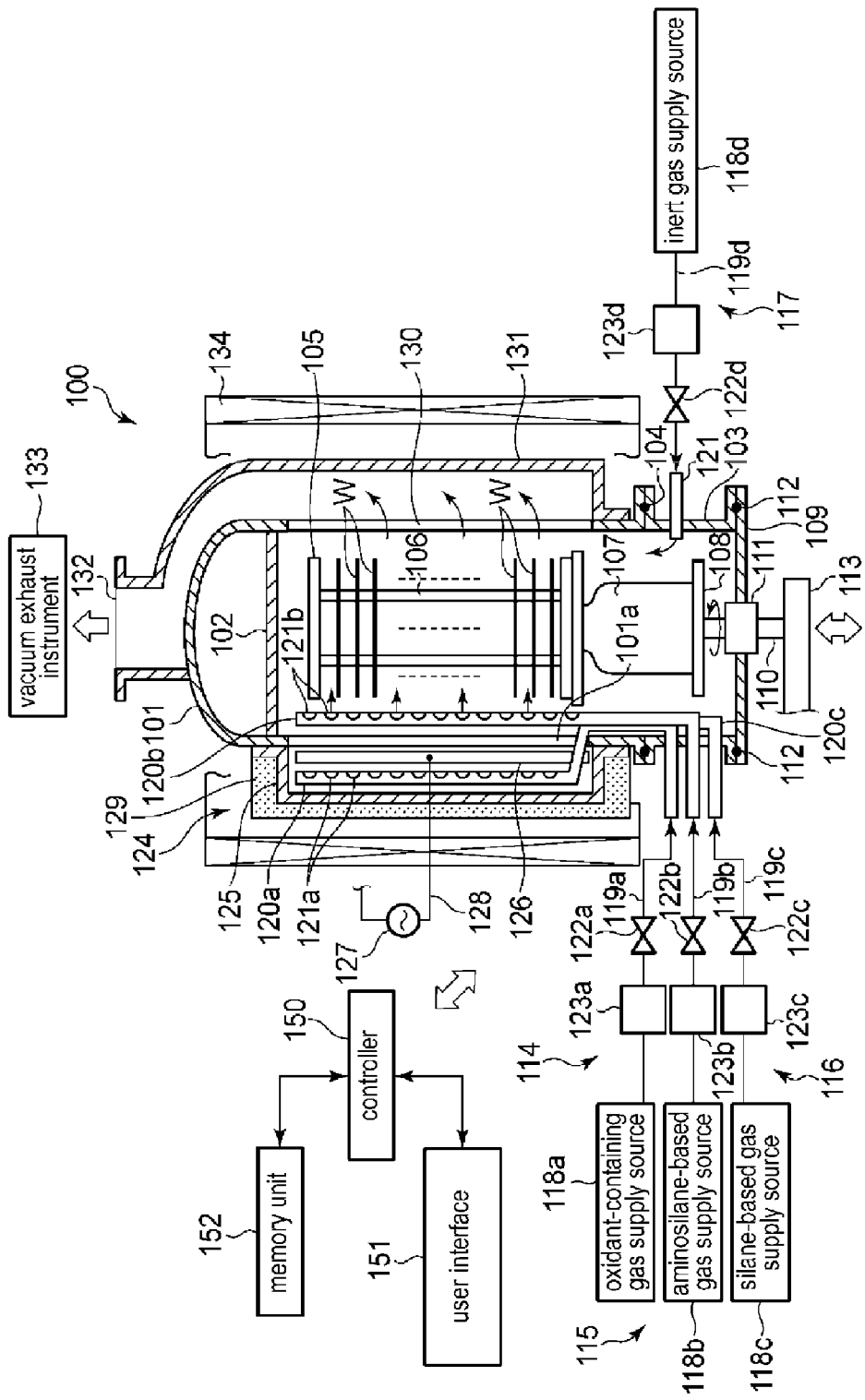
FIG. 9 is a longitudinal side elevational view showing an example of a film-forming apparatus for forming a silicon oxide liner.
Figure 10:
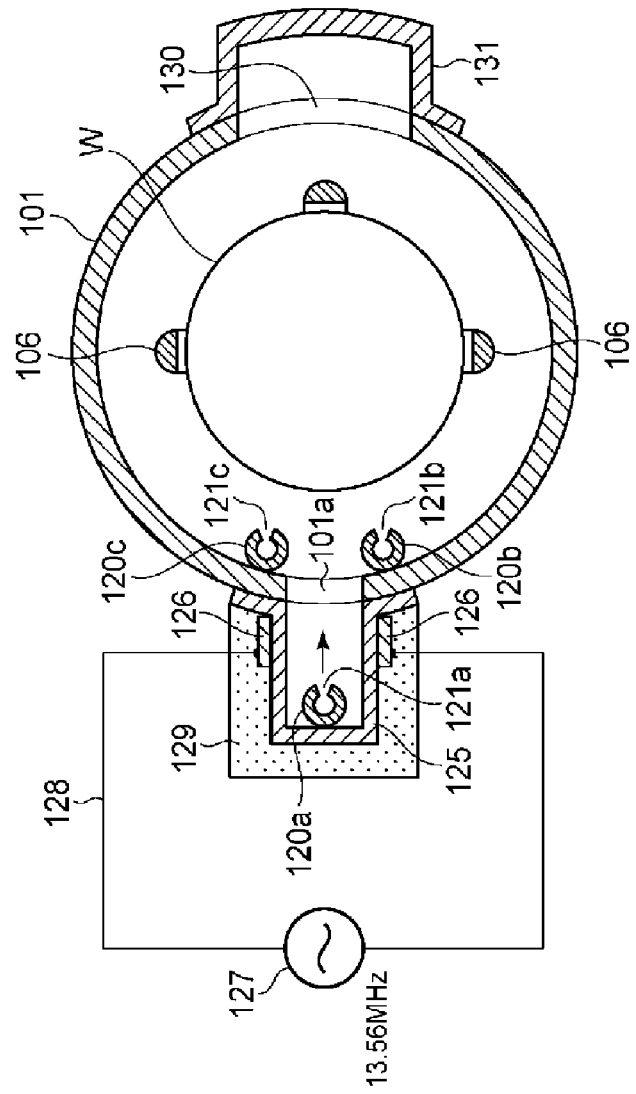
FIG. 10 is a transversal cross-sectional view of the film-forming apparatus shown in FIG. 9.

FIG. 9 is a longitudinal side elevational view showing an example of a film-forming apparatus for forming a silicon oxide liner, and FIG. 10 is a transversal cross-sectional view of the film-forming apparatus shown in FIG. 9. In FIG. 10, the heating unit is omitted.

As shown in FIG. 9, a film-forming apparatus for a silicon oxide liner 100 includes a cylindrical-shaped processing vessel 101 having a ceiling, in which a lower end portion is opened. The entirety of the processing vessel 101, for example, is formed of quartz. A ceiling plate 102 of quartz is disposed at the ceiling inside of the processing vessel 101 and the processing vessel 101 is sealed. Also, for example, a manifold 103 which is formed of stainless steel to have a cylindrical shape is connected to the lower end opening portion of the processing vessel 101 through a seal member 104 such as O-ring.

The manifold 103 supports the lower end portion of the processing vessel 101. A wafer boat 105 formed of quartz, in which a plurality of semiconductor wafers, for example, 50 to 100 semiconductor wafers (or silicon substrates) W, are loaded as objects to be processed in multiple stages, is insertable into the processing vessel 101 through a lower portion of the manifold 103. The wafer boat 105 includes three supporting pillars 106 (see FIG. 10), and the plurality of wafers W are supported by grooves which are formed in each of the supporting pillars 106.

The wafer boat 105 is loaded onto a table 108 through a heat insulating tube 107 formed of quartz. The table 108 is supported on a rotation axis 110 that passes through a lid 109, which is made of stainless steel, and opens or closes a lower end opening portion of the manifold 103.

A magnetic fluid seal 111 is disposed at a through portion of the rotation axis 110. The magnetic fluid seal 111 closely seals and rotatably supports the rotation axis 110. Also, a seal member 112, for example, an O-ring, is disposed between a peripheral portion of the lid 109 and the lower end portion of the manifold 103, thus maintaining sealability of the processing vessel 101.

The rotation axis 110, for example, is disposed at a front end of an arm 113 that is supported by an ascending/descending instrument (not shown) such as a boat elevator. The rotation axis 110 ascends or descends the wafer boat 105 and the lid 109 at the same time, and is inserted into or detached from the processing vessel 101. Also, the table 108 may be disposed to be fixed to a side of the lid 109, and the wafers W may be treated without the rotation of the wafer boat 105.

The film-forming apparatus 100 includes an oxidant-containing gas supply instrument 114, an aminosilane-based gas supply instrument 115, an amino group-free silane-based gas supply instrument 116 (hereinafter, "amino group-free silane-based gas" will be simply referred to as "silane-based gas"), and an inert gas supply instrument 117. The oxidant-containing gas supply instrument 114 supplies an oxidant-containing gas into the processing vessel 101, the aminosilane-based gas supply instrument 115 supplies an aminosilane-based gas into the processing vessel 101, the silane-based gas supply instrument 116 supplies a silane-based gas into the processing vessel 101, and the inert gas supply instrument 117 supplies an inert gas into the processing vessel 101. The inert gas is used as a purge gas and a dilution gas within the processing vessel 101.

Examples of an oxidant in the oxidant-containing gas may include oxygen gas ($O_2$ gas), water vapor ($H_2O$ vapor) or the like. Examples of the aminosilane-based gas and the silane-based gas are similar to those of the first embodiment. Examples of the inert gas may be nitrogen gas ($N_2$ gas), argon gas (Ar gas) or the like.

The oxidant-containing gas supply instrument 114 includes an oxidant-containing gas supply source 118a, an oxidant-containing gas supply pipeline 119a that induces the oxidant-containing gas from the oxidant-containing gas supply source 118a, and an oxidant-containing gas dispersion nozzle 120a formed of a quartz pipe. The oxidant-containing gas dispersion nozzle 120a is connected to the oxidant-containing gas supply pipeline 119a, and internally passes through a sidewall of the manifold 103. The oxidant-containing gas supply pipeline 119a is bent upwardly and extends vertically. A plurality of gas discharge holes 121a are formed at certain intervals in a vertical portion of the oxidant-containing gas supply dispersion nozzle 120a, and uniformly discharge the oxidant-containing gas from each of the gas discharge holes 121a toward the processing vessel 101 in a horizontal direction.

The aminosilane-based gas supply instrument 115 includes an aminosilane-based gas supply source 118b, an aminosilane-based gas supply pipeline 119b that induces the aminosilane-based gas from the aminosilane-based gas supply source 118b, and an aminosilane-based gas dispersion nozzle 120b connected to the aminosilane-based gas supply pipeline 119b. Like the oxidant-containing gas dispersion nozzle 120a, the aminosilane-based gas dispersion nozzle 120b is formed of a quartz pipe and internally passes through the sidewall of the manifold 103. Further, the aminosilane-based gas dispersion nozzle 120b is also bent upwardly and extends vertically. In addition, a plurality of gas discharge holes 121b are formed at certain intervals in a vertical portion of the aminosilane-based gas dispersion nozzle 120b.

The silane-based gas supply instrument 116 includes a silane-based gas supply source 118c, an silane-based gas supply pipeline 119c that induces the silane-based gas from the silane-based gas supply source 118c, and a silane-based gas dispersion nozzle 120c connected to the silane-based gas supply pipeline 119c. Like the aminosilane-based gas dispersion nozzle 120b, the silane-based gas dispersion nozzle 120c is formed of a quartz pipe and internally passes through the sidewall of the manifold 103. Further, the silane-based gas dispersion nozzle 120c is also bent upwardly and extends vertically. In addition, a plurality of gas discharge holes 121c (see FIG. 10) are formed at certain intervals in a vertical portion of the silane-based gas dispersion nozzle 120c.

The inert gas supply instrument 117 includes an inert gas supply source 118d, an inert gas supply pipeline 119d that induces the inert gas from the inert gas supply source 118d, and a purge gas nozzle 121 connected to the inert gas supply pipeline 119d, which internally passes through a sidewall of the processing vessel 101.

Opening/closing valves 122a to 122d and flow rate regulators 123a to 123d are sequentially disposed in the oxidant-containing gas supply pipeline 119a, the aminosilane-based gas supply pipeline 119b, the silane-based gas supply pipeline 119c, and the inert gas supply pipeline 119d, respectively. With this configuration, the oxidant-containing gas, the aminosilane-based gas, the silane-based gas, and the inert gas can be independently introduced into the processing vessel 101 with their flow rates being controlled.

A plasma generation instrument 124 configured to generate an oxidant-containing gas plasma is disposed at a portion of the sidewall of the processing vessel 101. The plasma generation instrument 124 includes a plasma partition wall 125. The plasma partition wall 125 is air-tightly welded on an outer wall of the processing vessel 101 such that an opening 101a formed in the sidewall of the processing vessel 101 is covered. The opening 101a has an elongated shape, which is formed by vertically chipping the sidewall of the processing vessel 101 at a certain width. The reason for this is to uniformly supply plasma and radicals via the opening 101a to the wafers W which are loaded into the wafer boat 105 in multiple stages. The plasma partition wall 125 formed of, e.g., quartz, has a C shaped sectional surface and is vertically formed in an elongated shape to correspond to the shape of the opening 101a. The plasma partition wall 125 is configured as above such that a portion of the sidewall of the processing vessel 101 protrudes outward in a convex shape and the internal space of the plasma partition wall 125 integrally communicates with the internal space of the processing vessel 101.

The plasma generation instrument 124 includes a pair of plasma electrodes 126, a high frequency power supply 127, and a power supply line 128 through which a high frequency power provided from the high frequency power supply 127 flows. The pair of plasma electrodes 126 have an elongated shape corresponding to the shape of the plasma partition wall 125, and are disposed to face each other with respect to the outer surfaces of both sidewalls of the plasma partition wall 125 in an up and down direction.

The oxidant-containing gas dispersion nozzle 120a is bent toward the outside of the processing vessel 101 while extending upwardly inside of the processing vessel 101. Further, the oxidant-containing gas dispersion nozzle 120a stands up upwardly along the innermost portion (which is the farthest away from the center of the processing vessel 101) in the plasma partition wall 125. With this configuration, turning on the high frequency power supply 127 generates a high frequency electrical field between the pair of plasma electrodes 126 such that the oxidant-containing gas that is injected from the gas discharge holes 121a of the oxidant-containing gas dispersion nozzle 120a is changed to plasma and it disperses and flows toward the center of the processing vessel 101. For example, applying a high frequency voltage of 13.65 MHz from the high frequency power supply 127 to the pair of plasma electrodes 126 generates an oxidant-containing gas plasma in the internal space of the plasma partition wall 125. The generated plasma contains oxygen radicals. Using the oxygen radicals, Operation 2 illustrated in the first and second embodiments, i.e., the radical oxidation for the first seed layer 4 and the silicon film 5, can be performed. The frequency of the high frequency voltage is not limited to 13.56 MHz. For example, other frequencies, e.g., 400 kHz or the like, may be used.

An insulation protection cover 129 formed of, e.g., quartz is provided at the outside of the plasma partition wall 125 to cover the plasma partition wall 125.

An exhaust opening 130 for vacuum-exhausting the inside of the processing vessel 101 is provided on the side opposite to the opening 101a of the processing vessel 101. The exhaust opening 130 has an elongated shape formed by chipping the sidewall of the processing vessel 101 in an up and down direction. An exhaust opening cover member 131, which is molded into a C-shaped sectional surface to cover the exhaust opening 130, is disposed through welding at a portion which corresponds to the exhaust opening 130 of the processing vessel 101. The exhaust opening cover member 131 extends upwardly along the sidewall of the processing vessel 101, and defines a gas outlet 132 at an upper portion of the processing vessel 101. A vacuum exhaust instrument 133, which may include a vacuum pump or the like, is connected to the gas outlet 132. The vacuum exhaust instrument 133 is configured to vacuum-exhaust the inside of the processing vessel 101 such that the process gas used in processing is exhausted and a pressure within the processing vessel 101 is set to a process pressure suitable for the processing.

A cylindrically shaped heating device 134 is installed on the outer periphery of the processing vessel 101. The heating device 134 activates the gas supplied into the processing vessel 101, and heats the wafers W loaded in the processing vessel 101.

Respective components of the film-forming apparatus 100 are controlled by, for example, a controller 150 including a microprocessor (e.g., a computer). The controller 150 is connected to a user interface 151 including a keyboard for inputting, by an operator, a command to control the film-forming apparatus 100, and a display unit (not shown) for displaying an operation state of the film-forming apparatus 100, or the like.

A memory unit 152 is connected to the controller 150. The memory unit 152 stores a control program for executing various processes in the film-forming apparatus 100 under the control of the controller 150, and a program (i.e., recipe) for executing a process in the respective components of the film-forming apparatus 100 according to the process conditions. For example, the recipe may be stored in a memory medium of the memory unit 152. The memory medium may include a hard disk, a semiconductor memory, a CD-ROM, a DVD, and a portable memory such as a flash memory. The recipe may be suitably transmitted from another device through, e.g., a dedicated line. If necessary, the recipe may be read from the memory unit 152 in response to a command received from the user interface 151, and the controller 150 executes a process according to the read recipe. In this way, the film-forming apparatus 100 may perform a desired process under the control of the controller 150.

In this example, Operation 2 illustrated in the first and second embodiments are executed under the control of the controller 150, thereby forming the silicon oxide liner 6.

<Film-Forming Apparatus for Nitriding and Forming Silicon Liner>

Figure 11:
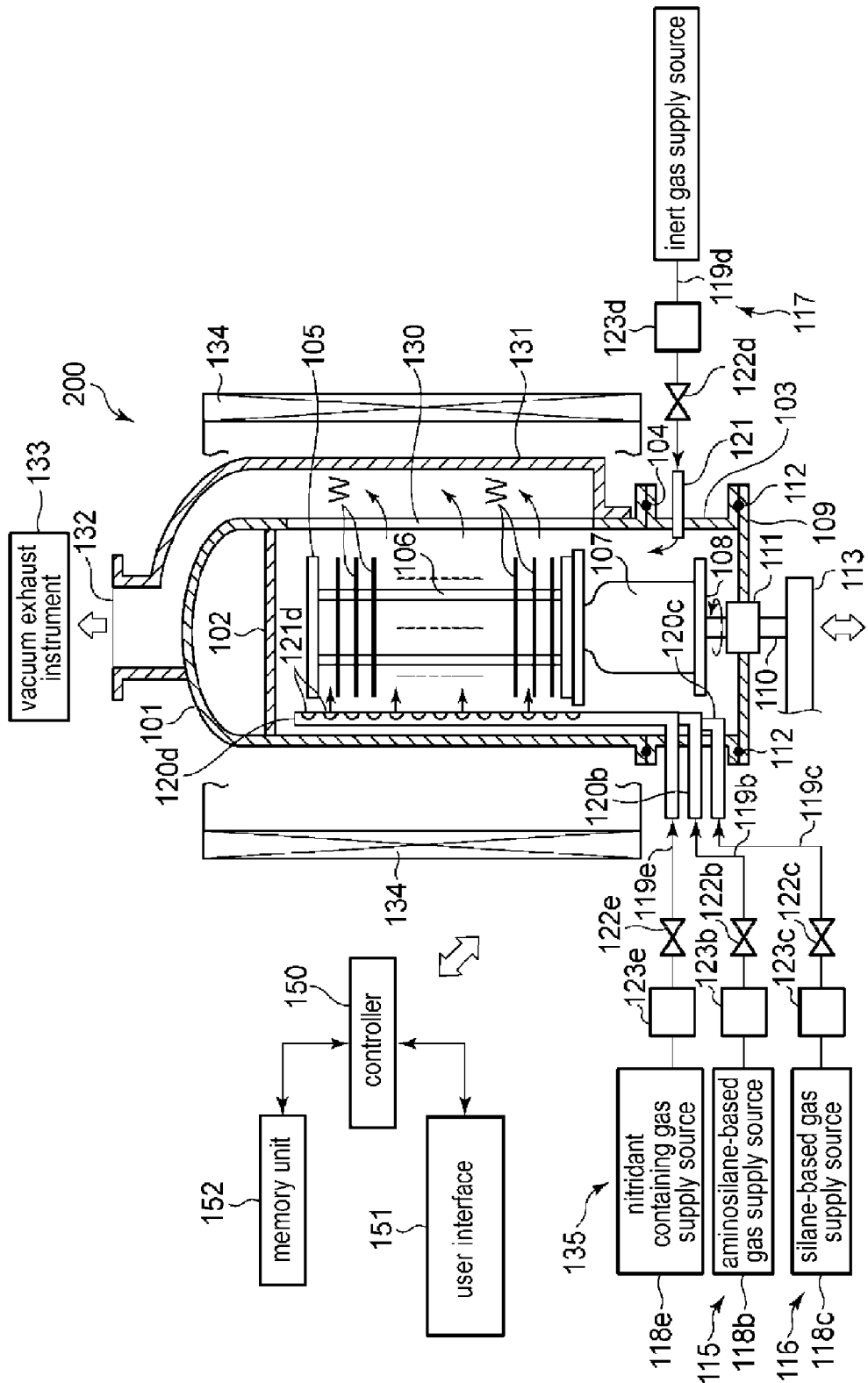
FIG. 11 is a longitudinal side elevational view showing an example of a film-forming apparatus for nitriding and forming a silicon liner.

FIG. 11 is a longitudinal side elevational view showing an example of a film-forming apparatus for nitriding and forming a silicon liner.

As shown in FIG. 11, a film-forming apparatus for nitriding and forming a silicon liner 200 is different from the film-forming apparatus for forming a silicon oxide liner 100 in that it does not include the plasma generation instrument 124, and includes a nitridant-containing supply instrument 135 instead of the oxidant-containing gas supply instrument 114.

The nitridant-containing gas supply instrument 135 supplies a nitridant-containing gas into the processing vessel 101. Examples of the nitridant-containing gas include an ammonia ($NH_3$)-containing gas, a nitrogen oxide (NO)-containing gas, an ammonia/nitrogen oxide-containing gas, or the like.

The nitridant-containing gas supply instrument 135 includes a nitridant-containing gas supply source 118e, a nitridant-containing gas supply pipeline 119e that induces the nitridant-containing gas from the nitridant-containing gas supply source 118e, and a nitridant-containing gas dispersion nozzle 120d connected to the nitridant-containing gas supply pipeline 119e. Like the aminosilane-based gas dispersion nozzle 120b or the like, the nitridant-containing gas dispersion nozzle 120d is formed of a quartz pipe and internally passes through the sidewall of the manifold 103. Further, the nitridant-containing gas dispersion nozzle 120d is also bent upwardly and extends vertically. In addition, a plurality of gas discharge holes 121d are formed at certain intervals in a vertical portion of the nitridant-containing gas dispersion nozzle 120d.

An opening/closing valve 122e and a flow rate regulator 123e are sequentially disposed in the nitridant-containing gas supply pipeline 119e. With this configuration, the nitridant-containing gas, the aminosilane-based gas, the silane-based gas, and the inert gas can be independently introduced into the processing vessel 101 with their flow rates controlled.

The film-forming apparatus 200 performs Operation 3 (i.e., forming the oxidation-barrier film) of the first embodiment under the control of the controller 150. With this configuration, the nitridant-containing gas is supplied to the silicon oxide liner 6 such that the silicon oxide liner 6 is subjected to nitriding and the oxidation-barrier film 7 composed of a silicon oxynitride film is formed.

Subsequently, the film-forming apparatus 200 performs Operation 4 (i.e., forming the silicon liner) of the first embodiment under the control of the controller 150. In this manner, the silicon liner 9 is formed on the oxidation-barrier film 7.

In some embodiments, such as in the case where the Operation 2 of the first embodiment is performed, for example, the silane-based gas supply instrument 116 may be configured to include a monosilane gas supply source that supplies a monosilane gas, and a disilane gas supply source that supplies a higher order silane gas (e.g., disilane gas) than monosilane gas, thereby selecting the monosilane gas or the disilane gas to supply the same to the silane-based gas dispersion nozzle 120c.

<Film-Forming Apparatus for Forming First Filling Material>

Figure 12:
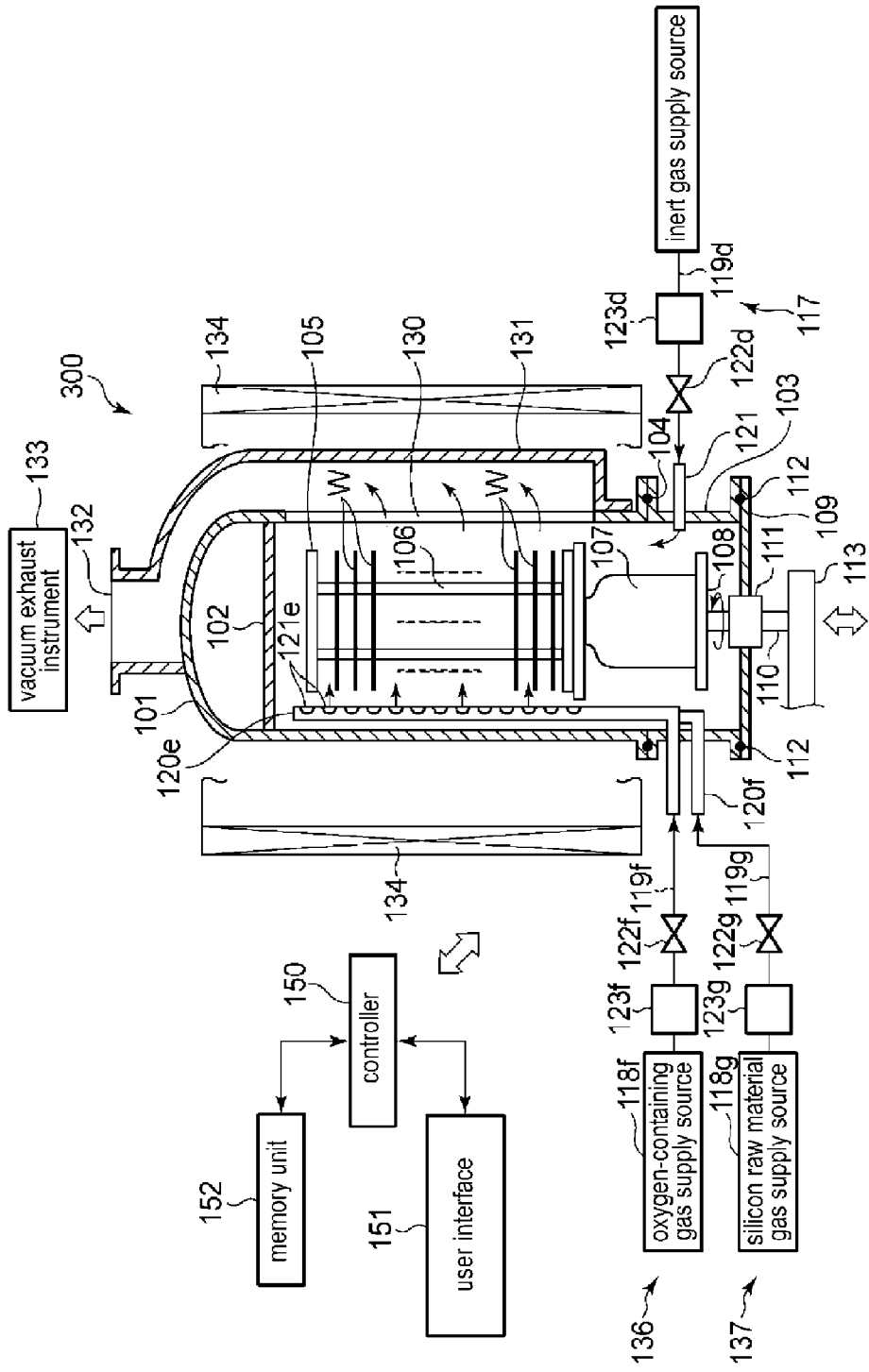
FIG. 12 is a longitudinal side elevational view showing an example of a film-forming apparatus for forming a first filling material.

FIG. 12 is a longitudinal side elevational view showing an example of a film-forming apparatus for forming a first filling material.

As shown in FIG. 12, a film-forming apparatus for forming a first filling material 300 is different from the film-forming apparatus for nitriding and forming a silicon liner 200 in that it includes an oxygen-containing gas supply instrument 136 and a silicon raw material gas supply source 137 instead of the nitridant-containing gas supply instrument 135, the aminosilane-based gas supply instrument 115, and the silane-based gas supply instrument 116.

The oxygen-containing gas supply instrument 136 includes an oxygen-containing gas supply source 118f, an oxygen-containing gas supply pipeline 119f that induces an oxygen-containing gas from the oxygen-containing gas supply source 118f, and an oxygen-containing gas dispersion nozzle 120e connected to the oxygen-containing gas supply pipeline 119f. Like the aminosilane-based gas dispersion nozzle 120b or the like, the oxygen-containing gas dispersion nozzle 120e is formed of a quartz pipe and internally passes through the sidewall of the manifold 103. Further, the oxygen-containing gas dispersion nozzle 120e is also bent upwardly and extends vertically. In addition, a plurality of gas discharge holes 121e are formed at certain intervals in a vertical portion of the oxygen-containing gas dispersion nozzle 120e. An example of the oxygen-containing gas may include oxygen gas ($O_2$ gas).

Similarly, the silicon raw material gas supply instrument 137 includes a silicon raw material gas supply source 118g, a silicon raw material gas supply pipeline 119g that induces a silicon raw material gas from the silicon raw material gas supply source 118g, and a silicon raw material gas dispersion nozzle 120f connected to the silicon raw material gas supply pipeline 119g. Like the aminosilane-based gas dispersion nozzle 120b or the like, the silicon raw material gas dispersion nozzle 120f is formed of a quartz pipe and internally passes through the sidewall of the manifold 103. Further, the silicon raw material gas dispersion nozzle 120f is also bent upwardly and extends vertically. In addition, a plurality of gas discharge holes (not shown) are formed at certain intervals in a vertical portion of the silicon raw material gas dispersion nozzle 120f. Examples of the silicon raw material gas may include bistertiarybutylaminosilane (BTBAS), bisdiethylaminosilane (BDEAS), bisdimethylaminosilane (BDMAS) or the like.

Opening/closing valves 122f and 122g and flow rate regulators 123f and 123g are sequentially disposed in the oxygen-containing gas supply pipeline 119f and the silicon raw material gas supply pipeline 119g, respectively. With this configuration, the oxygen-containing gas, the silicon raw material gas, and the inert gas can be independently introduced into the processing vessel 101 with their flow rates controlled.

The film-forming apparatus 300 performs Operation 5 of the first embodiment using the ALD process that alternately supplies the silicon raw material gas and the oxygen-containing gas, under the control of the controller 150. In this way, the first filling material, e.g., the ALD-silicon oxide film 10, is formed on the silicon liner 9.

<Film-Forming System for Performing Operations 2 to 5>

Figure 13:
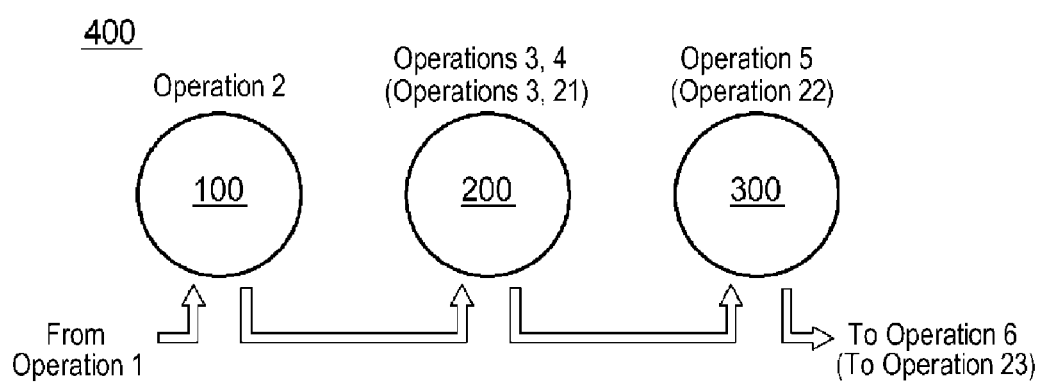
FIG. 13 is a view showing an example of a film-forming system which is capable of performing Operations 2 to 5.

FIG. 13 is a view showing an example of a film-forming system which is capable of performing Operations 2 to 5.

As shown in FIG. 13, a film-forming system 400 includes the film-forming apparatuses 100, 200, and 300 shown in FIGS. 9, 10, 11, and 12, respectively.

In this example, a wafer W with the trench 2 formed therein (Operation 1) is loaded into the film-forming apparatus 100 of the film-forming system 400 while being held in the wafer boat 105. In the film-forming apparatus 100, the silicon oxide liner 6 is formed on the wafer W (Operation 2), and then the wafer W is loaded into the film-forming apparatus 200 while being held in the wafer boat 105. In the film-forming apparatus 200, the silicon liner 9 is formed in the wafer W (Operations 3 and 4), and then the wafer W is loaded into the film-forming apparatus 300 while being held in the wafer boat 105. In the film-forming apparatus 300, the first filling material, e.g., the ALD-silicon oxide film 10, is formed in the wafer W (Operation 5), and then the wafer W undergoes Operation 6, i.e., forming the second filling material, while being held in the wafer boat 105.

As described above, disposing the three film-forming apparatuses 100, 200 and 300 in the inside of the film-forming system 400 in a serial fashion enables Operations 2 to 5 to be sequentially performed with respect to the wafer W.

Figure 14:
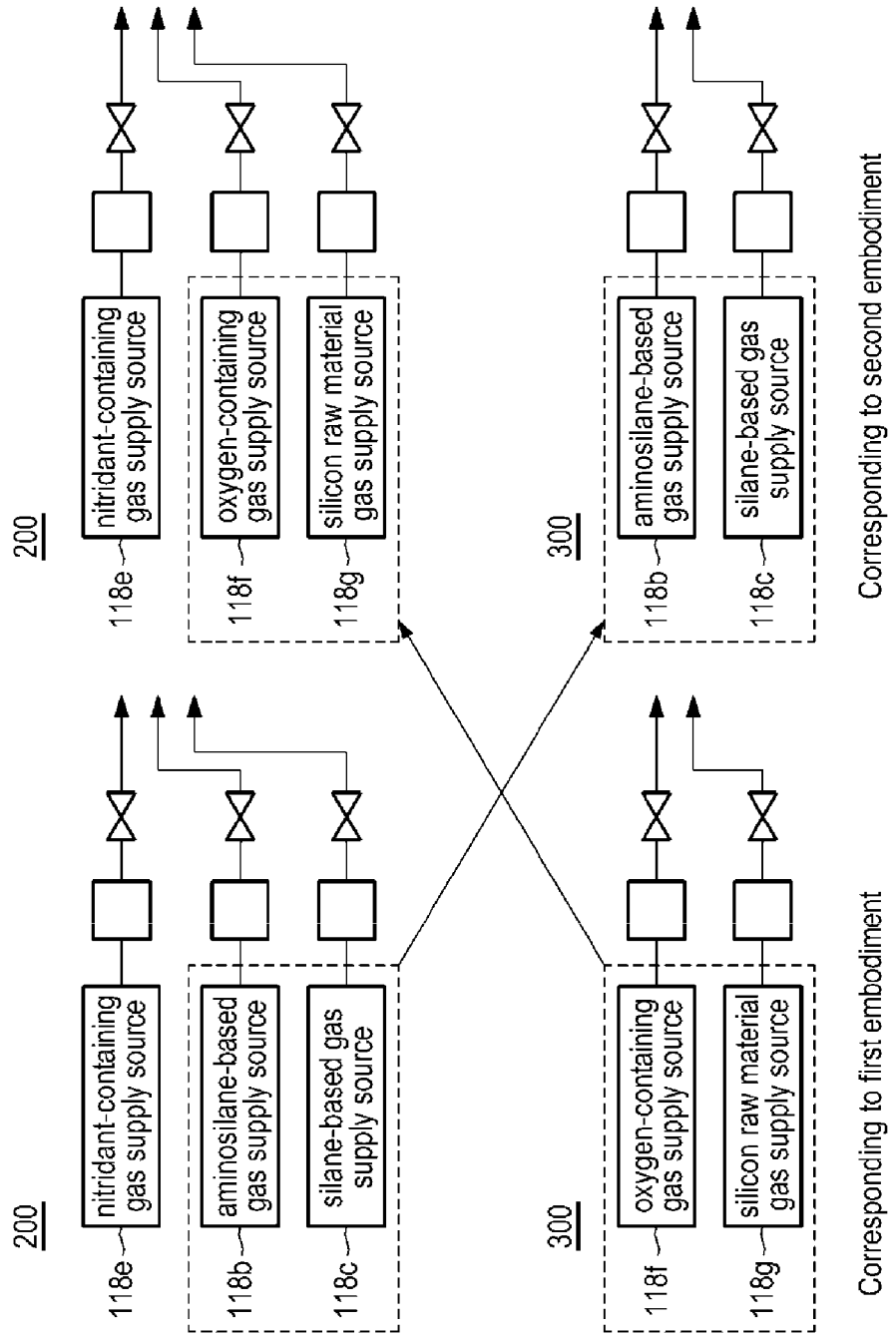
FIG. 14 is a view schematically showing a modified film-forming system, which corresponds to the second embodiment.

In the second embodiment, in contrast to the first embodiment, Operations 4 and 5 of the first embodiment are performed in the reverse order. In this case, as shown in FIG. 14, the aminosilane-based gas supply source 118*b* and the silane-based gas supply source 118*c* of the film-forming apparatus 200 are moved to the film-forming apparatus 300, while the oxygen-containing gas supply source 118*f* and the silicon raw material gas supply source 118*g* of the film-forming apparatus 300 are moved to the film-forming apparatus 200.

In this way, the respective gas supply sources are replaced according to the Operations 4 and 5, which makes it possible to perform the operations of the second embodiment in the desired order.

For example, in the film-forming apparatus 200, as indicated in parentheses in FIG. 13, the first filling material, e.g., the ALD-silicon oxide film 10, is formed (Operation 21), and then the wafer W is loaded into the film-forming apparatus 300 while being held in the wafer boat 105. In the film-forming apparatus 300, the silicon liner 9 is formed in the wafer W (Operation 22), and then the wafer W undergoes Operation 23, i.e., forming the second filling material, while being held in the wafer boat 105.

In the above, the present disclosure has been described to be embodied in two embodiments, but is not limited thereto. Alternatively, the present disclosure may be embodied in various modes of embodiments.

For example, although in the embodiments the process conditions have been specifically described, the process conditions are not limited thereto.

Further, although the PHPS film 12 using the SOD process has been described to be used as the second filling material, the second filling material is not limited thereto. For example, a silicon oxide film formed by a high-density plasma CVD process, or a silicon oxide film formed by a fluid CVD process may be used as the second filling material. These silicon oxide films also need to be subjected to heat treatment so that the silicon oxide films can be cured. During such heat treatment, the silicon liner 9 is oxidized and thus the silicon liner 9 is changed into the silicon oxide film 14 and expanded, such that a shrinkage amount of the silicon oxide film 14 formed by the high-density plasma CVD process or the fluid CVD process can be compensated, as in the first and second embodiments.

Further, although in the first and second embodiments, the description has been given as to filling the narrow-width portions 2N and the wide-width portions 2W of the trench 2, the present disclosure is also applicable to filling only the narrow-width portions 2N of the trench 2. For example, according to the first embodiment, as shown in FIGS. 2I and 2J, the seams 11 of a gap shape formed inside of the narrow-width portions 2N can be closed by changing and expanding the silicon liner 9 into the silicon oxide film 14.

Similarly, even in the second embodiment, as shown in FIGS. 8C and 8D, the voids 15 occurred in the narrow-width portions 2N can be closed by changing and expanding the silicon liner 9 into the silicon oxide film 14.

According to the present disclosure, it is possible to limit deterioration in the insulation property of a device isolation region, even if the high integration of device is improved and the aspect ratio of a trench becomes higher.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A trench filling method, comprising:
    forming a silicon oxide liner on a semiconductor substrate with trenches formed therein, the trenches including narrow-width portions having a first minimum isolation width and wide-width portions having a second minimum isolation width being wider than the first minimum isolation width;
    forming an oxidation-barrier film on the silicon oxide liner;
    forming a silicon liner on the oxidation-barrier film;
    filling the narrow-width portions of the trenches with a first filling material;
    filling the wide-width portions of the trenches with a second filling material, the second filling material being different from the first filling material and shrunk while being modified into a silicon oxide by sintering; and
    oxidizing the silicon liner such that seams occurring in the narrow-width portions of the trenches are closed.

2. The method of claim 1, wherein forming the silicon oxide liner includes:
    forming a first seed layer on the semiconductor substrate by supplying an aminosilane-based gas to the semiconductor substrate;
    forming a silicon film on the first seed layer by supplying an amino group-free silane-based gas to the first seed layer; and
    forming the silicon oxide liner by oxidizing the first seed layer and the silicon film.

3. The method of claim 2, wherein forming the silicon liner includes:

forming a second seed layer on the oxidation-barrier film by supplying an aminosilane-based gas to the oxidation-barrier film; and forming the silicon liner on the second seed layer by supplying an amino group-free silane-based gas to the second seed layer.

4. The method of claim 3, wherein forming the silicon liner on the second seed layer is any one of:

forming the silicon liner on the second seed layer by supplying a higher order silane-based gas than monosilane to the second seed layer after forming the second seed layer;

forming the silicon liner on the second seed layer by supplying a higher order silane-based gas than monosilane to the second seed layer after forming the second seed layer such that a silicon is thinly absorbed to the surface of the second seed layer, and then supplying a lower order silane-based gas than the higher order silane-based gas to the second seed layer; and forming the silicon liner on the second seed layer by supplying monosilane to the second seed layer after forming the second seed layer.

5. The method of claim 4, wherein, when the film thickness of the silicon liner is set to be less than 3 nm, forming the silicon liner on the second seed layer is performed by supplying a higher order silane-based gas than monosilane to the second seed layer after forming the second seed layer, when the film thickness of the silicon liner is set to be 3 nm or more and is less than 5 nm, forming the silicon liner on the second seed layer is performed by supplying a higher order silane-based gas than monosilane to the second seed layer after forming the second seed layer such that a silicon is thinly absorbed to the surface of the second seed layer, and then supplying a lower order silane-based gas than the higher order silane-based gas to the second seed layer, and when the film thickness of the silicon liner is set to be 5 nm or more, forming the silicon liner on the second seed layer is performed by forming the silicon liner on the second seed layer by supplying monosilane to the second seed layer after forming the second seed layer.

6. The method of claim 2, wherein the aminosilane-based gas is at least one selected from a group consisting of butylaminosilane (BAS), bistertiarybutylaminosilane (BTBAS), dimethylaminosilane (DMAS), bisdimethylaminosilane (BDMAS), tridimethylaminosilane (TDMAS), diethylaminosilane (DEAS), bisdiethylaminosilane (BDEAS), dipropylaminosilane (DPAS), and diisopropylaminosilane (DIPAS), and wherein the amino group-free silane-based gas is at least one selected from a group consisting of monosilane ($SiH_4$), disilane ($Si_2H_6$), silicon hydride expressed by $Si_mH_{2m+2}$ (wherein, m is a natural number being 3 or higher), and silicon hydride expressed by $Si_nH_{2n}$ (wherein, n is a natural number being 3 or higher).

7. The method of claim 1, wherein a radical oxidation process is used in forming the silicon oxide liner on the semiconductor substrate.

8. The method of claim 1, wherein an Atomic Layer Deposition (ALD) process is used in filling the narrow-width portions of the trenches with the first filling material.

9. The method of claim 1, wherein any one of an SOD process, a high-density plasma CVD process and a fluid CVD process is used in filling the wide-width portions of the trenches with the second filling material.

10. The method of claim 1, wherein oxidizing the silicon liner includes modifying the second filling material.

11. The method of claim 1, wherein oxidizing the silicon liner employs a wet oxidation process.

12. The method of claim 1, wherein forming the silicon liner includes:

forming a seed layer on the oxidation-barrier film by supplying an aminosilane-based gas to the oxidation-barrier film; and forming the silicon liner on the seed layer by supplying an amino group-free silane-based gas to the seed layer.

13. A method of manufacturing a semiconductor integrated circuit (IC) device, comprising:

forming trenches in a semiconductor substrate, the trenches including narrow-width portions having a first minimum isolation width in a memory cell area and wide-width portions having a second minimum isolation width being wider than the first minimum isolation width in a peripheral circuit area;

forming a silicon oxide liner on the semiconductor substrate on which the trenches are formed;

forming an oxidation-barrier film on the silicon oxide liner;

forming a silicon liner on the oxidation-barrier film;

filling the trenches of the memory cell area with a first filling material;

filling the trenches of the peripheral circuit area with a second filling material, the second filling material being different from the first filling material and shrunk while being modified into a silicon oxide by sintering; and oxidizing the silicon liner such that seams occurring in the narrow-width portions of the trenches are closed.

14. A trench filling method, comprising:

forming a silicon oxide liner on a semiconductor substrate with trenches formed therein, the trenches including narrow-width portions having a first minimum isolation width and wide-width portions having a second minimum isolation width being wider than the first minimum isolation width;

forming an oxidation-barrier film on the silicon oxide liner;

forming a first filling material on the oxidation-barrier film;

forming a silicon liner on the first filling material;

filling the wide-width portions of the trenches with a second filling material; and oxidizing the silicon liner to fill the narrow-width portions of the trenches.

15. A method of manufacturing a semiconductor integrated circuit (IC) device, comprising:

forming trenches in a semiconductor substrate, the trenches including narrow-width portions having a first minimum isolation width in a memory cell area and wide-width portions having a second minimum isolation width being wider than the first minimum isolation width in a peripheral circuit area;

forming a silicon oxide liner on the semiconductor substrate on which the trenches are formed;

forming an oxidation-barrier film on the silicon oxide liner;

forming a first filling material on the oxidation-barrier film;

forming a silicon liner on the first filling material;

filling the trenches of the peripheral circuit area with a second filling material; and oxidizing the silicon liner to fill the trenches of the memory cell area.

* * * * *